United States Patent
Kato et al.

(10) Patent No.: US 8,137,458 B2
(45) Date of Patent: Mar. 20, 2012

(54) EPITAXIAL GROWTH OF ZNO WITH CONTROLLED ATMOSPHERE

(75) Inventors: Hiroyuki Kato, Yokohama (JP); Michihiro Sano, Odawara (JP)

(73) Assignee: Stanley Electric Co., Ltd., Tokyo (JP)

( * ) Notice: Subject to any disclaimer, the term of this patent is extended or adjusted under 35 U.S.C. 154(b) by 145 days.

(21) Appl. No.: 12/028,310

(22) Filed: Feb. 8, 2008

(65) Prior Publication Data

US 2008/0185580 A1  Aug. 7, 2008

Related U.S. Application Data

(63) Continuation of application No. PCT/JP2006/315675, filed on Aug. 8, 2006.

(30) Foreign Application Priority Data

Aug. 9, 2005  (JP) .................................. 2005-230730
Aug. 9, 2005  (JP) .................................. 2005-230731

(51) Int. Cl.
*C30B 29/16* (2006.01)

(52) U.S. Cl. .............................. 117/89; 117/108; 438/22

(58) Field of Classification Search .................... 257/43, 257/E21.149; 438/22; 117/108, 89
See application file for complete search history.

(56) References Cited

U.S. PATENT DOCUMENTS

| | | | |
|---|---|---|---|
| 6,291,085 B1 * | 9/2001 | White et al. .................. 428/642 |
| 6,531,408 B2 * | 3/2003 | Iwata et al. .................... 438/758 |
| 6,664,565 B1 * | 12/2003 | Sano et al. ....................... 257/43 |
| 6,896,731 B1 | 5/2005 | Yamamoto et al. |
| 7,176,054 B2 * | 2/2007 | Nause et al. .................... 438/104 |
| 7,288,208 B2 * | 10/2007 | Sano et al. ..................... 216/101 |
| 7,482,618 B2 * | 1/2009 | Kato et al. ....................... 257/13 |
| 7,535,162 B2 * | 5/2009 | Ohashi et al. ................. 313/503 |
| 2002/0025594 A1 * | 2/2002 | Iwata et al. ..................... 438/46 |
| 2004/0235212 A1 * | 11/2004 | Ishizaki .......................... 438/46 |
| 2005/0145840 A1 * | 7/2005 | Kato et al. ....................... 257/43 |
| 2006/0018816 A1 * | 1/2006 | Nause et al. ................... 423/324 |
| 2006/0170013 A1 * | 8/2006 | Kato et al. ..................... 257/252 |
| 2007/0034144 A1 * | 2/2007 | Ogawa et al. .................. 117/95 |
| 2007/0134842 A1 * | 6/2007 | Kotani et al. .................. 438/104 |
| 2007/0264429 A1 * | 11/2007 | Hamilton et al. ......... 427/255.33 |
| 2008/0185580 A1 * | 8/2008 | Kato et al. ....................... 257/43 |
| 2009/0008660 A1 * | 1/2009 | Yamamuro et al. ............. 257/96 |

(Continued)

FOREIGN PATENT DOCUMENTS

EP  1215310 A1  6/2002

(Continued)

OTHER PUBLICATIONS

Elam et al "Growth of ZnO/Al2O3 Alloy Films Using Atomic Layer Deposition Techniques" Journal of Crystal Growth 265 (2004) 375-381.*

(Continued)

*Primary Examiner* — Bob M Kunemund
(74) *Attorney, Agent, or Firm* — Chen Yoshimura LLP

(57) ABSTRACT

A ZnO crystal growth method has the steps of (a) preparing a substrate having a surface capable of growing ZnO crystal exposing a Zn polarity plane; (b) supplying Zn and O above the surface of the substrate by alternately repeating a Zn-rich condition period and an O-rich condition period; and (c) supplying conductivity type determining impurities above the surface of the substrate while Zn and O are supplied at the step (b).

23 Claims, 21 Drawing Sheets

U.S. PATENT DOCUMENTS

| | | | |
|---|---|---|---|
| 2009/0045398 A1* | 2/2009 | Kato et al. | 257/43 |
| 2009/0061559 A1* | 3/2009 | Yamamuro et al. | 438/104 |
| 2009/0206333 A1* | 8/2009 | Kotani et al. | 257/43 |

FOREIGN PATENT DOCUMENTS

| | | |
|---|---|---|
| JP | 2001-048698 A | 2/2001 |
| JP | 2002-289918 A | 10/2002 |
| JP | 2002-326895 A | 11/2002 |
| JP | 2005-197410 A | 7/2005 |
| WO | 01/12884 A1 | 2/2001 |

OTHER PUBLICATIONS

Iwata, et al. "Nitrogen-induced defects in ZnO : N grown on sapphire substrate by gas source MBE", Journal of Crystal Growth, vol. 209, Feb. 1, 2000, pp. 526-531.

Ko, et al. "Ga-doped ZnO films grown on GaN templates by plasma-assisted molecular-beam epitaxy", Applied Physics Letters, vol. 77, No. 23, Dec. 2000, pp. 3761-3763.

Kato, et al. "Effect of O/Zn Flux Ratio on Crystalline Quality of ZnO Films Grown by Plasma-Assisted Molecular Beam Epitaxy", Jpn. J. Apply. Phys., vol. 42, Apr. 2003, pp. 2241-2244.

Kato, et al. "Homoexpitaxial Growth of High-Quality Zn-Polar ZnO Films by Plasma-Assisted Molecular Beam Epitaxy", Jpn. J. Apply. Phys., vol. 42, Aug. 2003, L1002-L1005.

Kato, et al. "High-quality ZnO Epilayers Grown on Zn-face ZnO Substrates by Plasma-Assisted Molecular Beam Epitaxy", Journal of Crystal Growth, vol. 265, 2004 pp. 375-381.

Kato, et al. "Growth and Characterization of Ga-doped ZnO Layers on A-plane Sapphire Substrates Grown by Molecular Beam Epitaxy", Journal of Crystal Growth, vol. 237-239, 2002 pp. 538-543.

Kato, et al. "Growth of MBE-ZnO on C-plane Sapphire and ZnO Substrates—High Quality of Crystal and N-type Doping—", The Japan Society of Applied Physics, Crystal Engineering Sub-committee, written in 120-th Study Forum Text, Apr. 23, 2004.

International Search Report (ISR) for PCT/JP2006/310245 for Examiner consideration, Oct. 25, 2006.

PCT/ISA/237 in PCT/JP2006/310245 and its translation of Section V, Oct. 25, 2006.

Japanese Office Action dated Dec. 20, 2011, in counterpart Japanese patent application No. 2007-529595, citing JP2002-326895, JP2002-289918, JP2001-048698, and Non-Patent Literature H Kato et al., Jpn. J. Appl. Phys., Aug. 15, 2003, vol. 42, Pt. 2, No. 8B, pp. L1002-1005 all of which have been submitted in a previous IDS. A partial translation of the Office Action is attached as a concise explanation of relevance.

A machine translation (not reviewed for accuracy) of paragraph Nos. [0030] and [0031] as well as full machine translation of JP2002-326895 attached.

\* cited by examiner

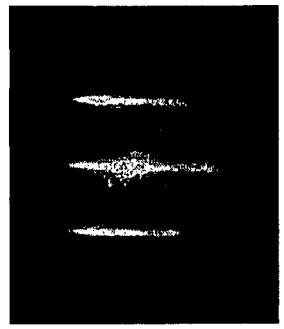
FIG.3R14
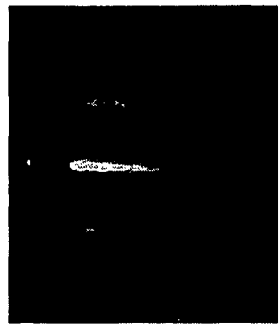
FIG.3R13
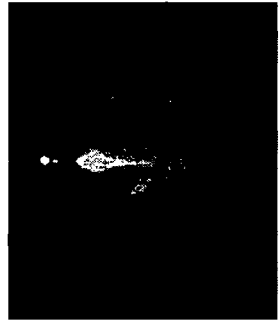
FIG.3R12
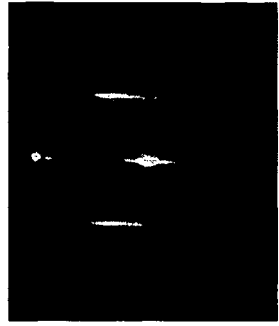
FIG.3R11
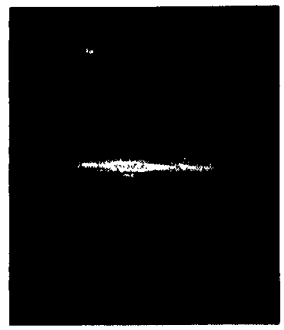
FIG.3R24
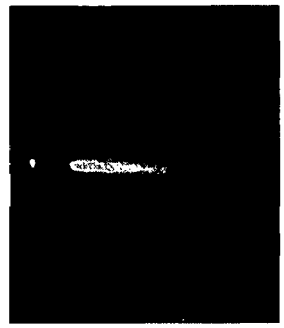
FIG.3R23
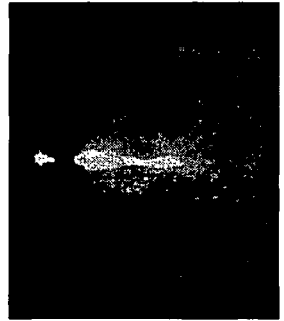
FIG.3R22
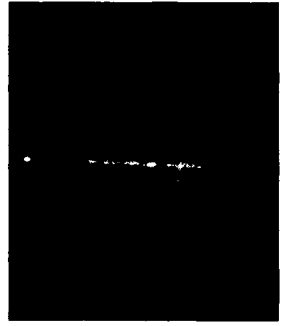
FIG.3R21

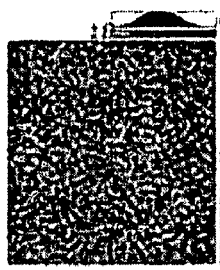
FIG.3M14
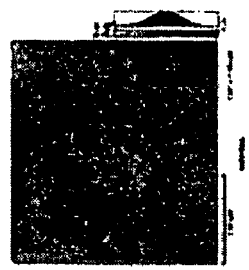
FIG.3M24
FIG.3M13
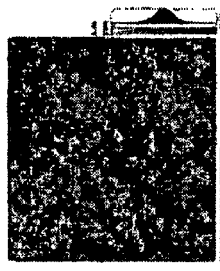
FIG.3M12
FIG.3M11
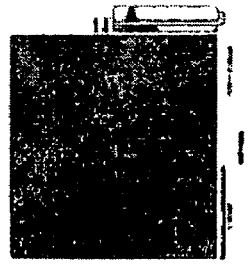
FIG.3M21

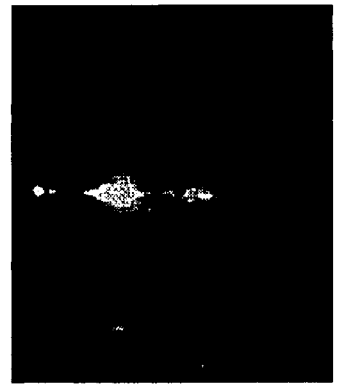
FIG.3R17
FIG.3R27
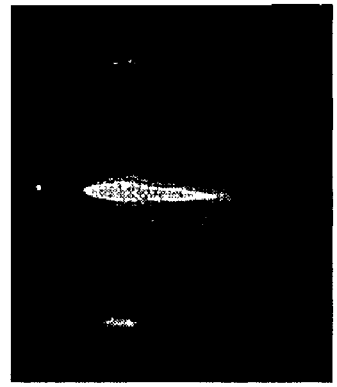
FIG.3R16
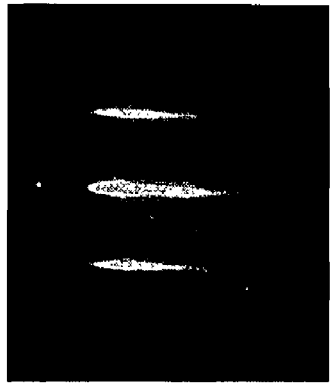
FIG.3R26
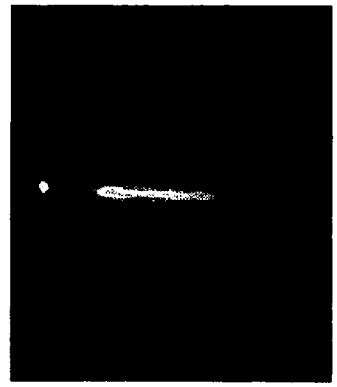
FIG.3R15
FIG.3R25

FIG. 3M17
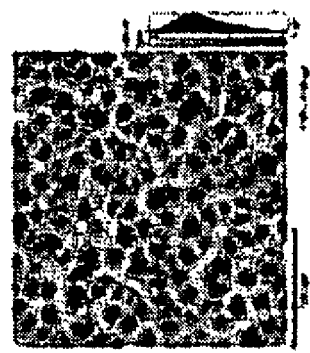
FIG. 3M27
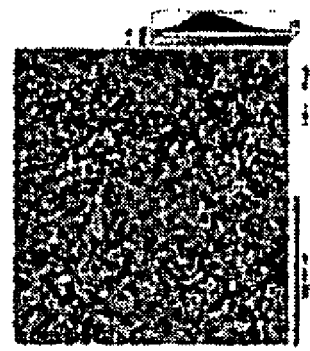
FIG. 3M16
FIG. 3M26
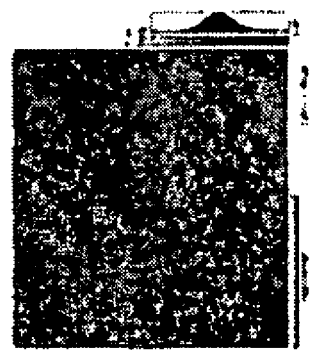
FIG. 3M15

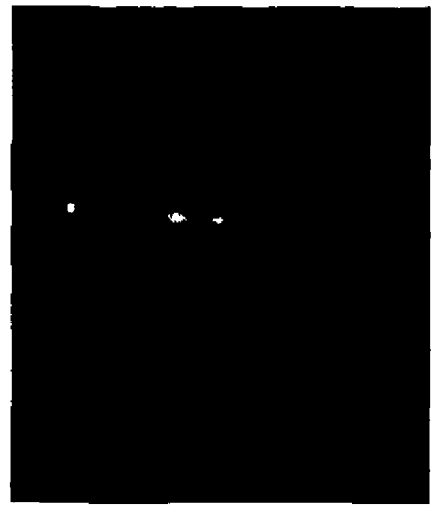
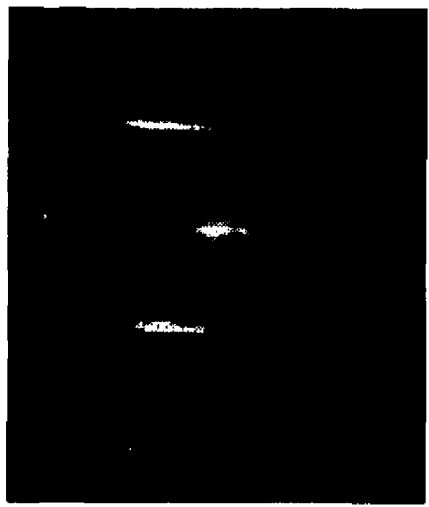

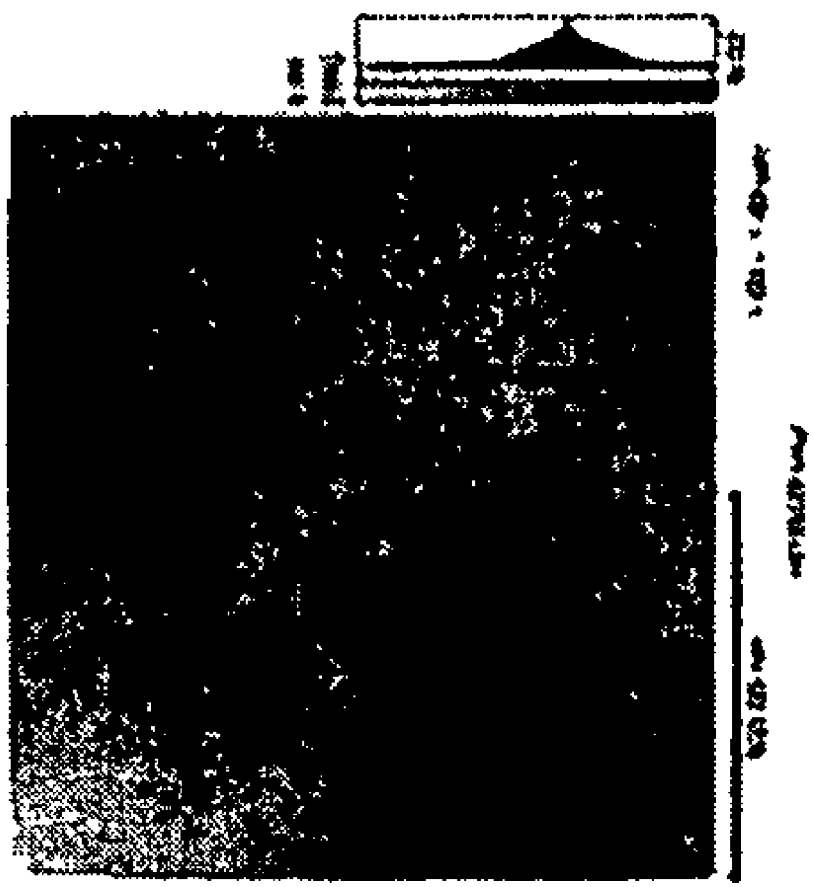

FIG.11R11
FIG.11R21
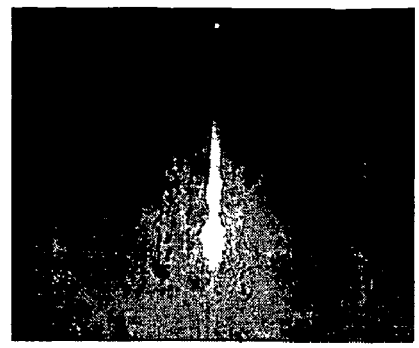
FIG.11R12
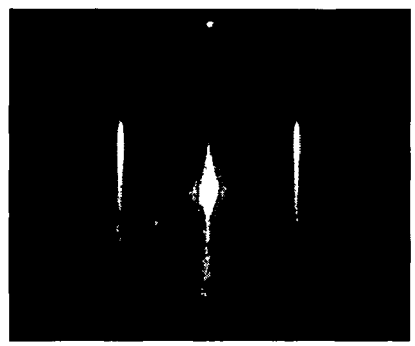
FIG.11R22
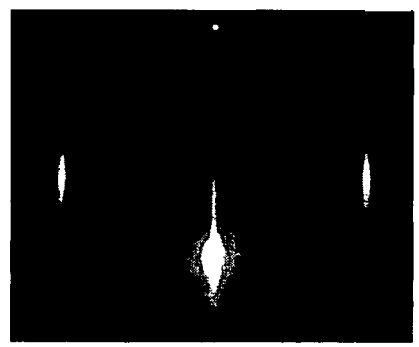
FIG.11R13
FIG.11R23
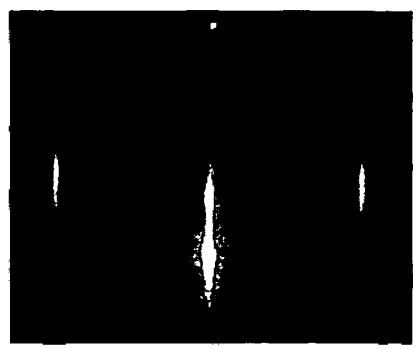

FIG.11R14
FIG.11R24
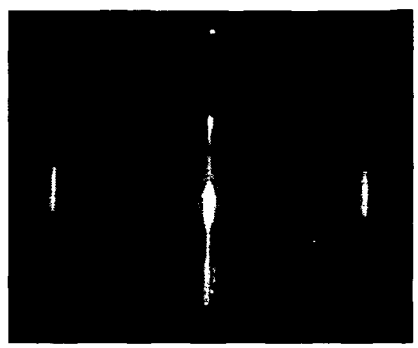
FIG.11R15
FIG.11R25
FIG.11R16
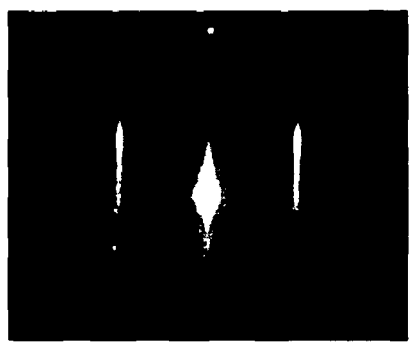
FIG.11R26
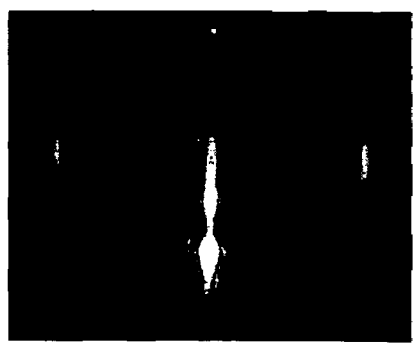

FIG.12R1
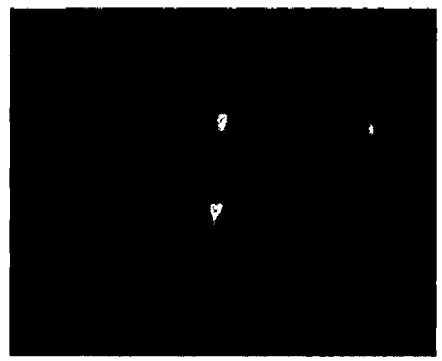
FIG.12R2

US 8,137,458 B2

EPITAXIAL GROWTH OF ZNO WITH CONTROLLED ATMOSPHERE

CROSS REFERENCE TO RELATED APPLICATION

This application is a continuation of PCT International Application PCT/JP2006/315675 filed on Aug. 8, 2006, which claims priority on Japanese patent applications 2005-230730 and 2005-230731, both of which were filed in Japan on Aug. 9, 2005. The entire contents of the PCT International Application, JP2005-230730, and JP2005-230731 are hereby incorporated by reference.

BACKGROUND OF THE INVENTION

A) Field of the Invention

The present invention relates to ZnO crystal and its growth method. The present invention relates also to a manufacture method for a light emitting device using ZnO.

B) Description of the Related Art

Zinc oxide (ZnO) is semiconductor of a direct transition type having a band gap of 3.37 eV at a room temperature, and has a large exciton binding energy of 60 meV (e.g., a binding energy of zinc selenide (ZnSe) is 18 meV and a binding energy of gallium nitride (GaN) is 24 meV). ZnO is expected as material of a high efficiency light emitting device. For example, in manufacturing a light emitting diode, it is necessary to obtain p- or n-type ZnO by doping impurities. For example, nitrogen (N) is doped as p-type impurities and gallium (Ga) is doped as n-type impurities.

ZnO crystal has a wurtzite structure having a +c plane (a plane exposing Zn surface, i.e. Zn polarity plane) and a −c plane (a plane exposing O surface, i.e. O polarity plane) relative to a c-axis direction. For example, technologies of growing ZnO crystal exposing the Zn polarity plane on a sapphire substrate (growing ZnO crystal with the Zn polarity plane) is disclosed in JP-A-2002-326895, the entire contents of which are incorporated herein by reference. JP-A-2002-326895 discloses that ZnO crystal doped with N during growth with the Zn polarity plane has a higher photoluminescence (PL) than ZnO crystal doped with N during growth with the O polarity plane.

It is therefore considered that ZnO crystal grown with the Zn polarity plane is more suitable for manufacturing a light emitting device than ZnO crystal grown with the O polarity plane.

Growth of ZnO crystal includes growth with a flat surface (two-dimensional growth) and growth without a flat surface (three-dimensional growth). For example, in manufacturing a light emitting device, it is preferable to two-dimensionally grow ZnO crystal.

Further, in order to grow p-type ZnO crystal suitable for light emitting devices, it is desired to use a crystal growth method capable of doping p-type impurities at a desired concentration. It is also desired to use a crystal growth method capable of having a desired n-type carrier concentration (electron concentration) in order to make n-type ZnO crystal suitable for light emitting devices.

SUMMARY OF THE INVENTION

An object of the present invention is to provide a novel method of growing ZnO crystal having an exposed Zn polarity plane and doped with conductivity type determining impurities.

Another object of the present invention is to provide a method capable of two-dimensionally growing p-type ZnO crystal with an exposed Zn polarity plane and being suitable for doping p-type impurities at a desired concentration, and to p-type ZnO crystal obtained by this method.

Still another object of the present invention is to provide a novel growth method for p-type ZnO crystal.

Still another object of the present invention is to provide a method capable of two-dimensionally growing n-type ZnO crystal with an exposed Zn polarity plane and being suitable for doping n-type impurities at a desired concentration, and to n-type ZnO crystal obtained by this method.

Still another object of the present invention is to provide a novel growth method for n-type ZnO crystal.

Still another object of the present invention is to provide a novel manufacture method for a light emitting device using ZnO.

According to a first aspect of the present invention, there is provided a ZnO crystal growth method comprising steps of: (a) preparing a substrate having a surface capable of growing ZnO crystal exposing a Zn polarity plane; (b) supplying Zn and O above the surface of the substrate by alternately repeating a Zn-rich condition period and an O-rich condition period; and (c) supplying conductivity type determining impurities above the surface of the substrate while Zn and O are supplied at the step (b).

According to a second aspect of the present invention, in the ZnO crystal growth method of the first aspect, the step (c) includes a step (c-1) of supplying at least one of N, P and As of p-type impurities as the conductivity type determining impurities.

According to a third aspect of the present invention, in the ZnO crystal growth method of the first aspect, the step (c) includes a step (c-3) of supplying at least one of Ga, Al and In of n-type impurities as the conductivity type determining impurities.

According to a fourth aspect of the present invention, there is provided a light emitting device manufacture method comprising steps of: (a) preparing a substrate having a surface capable of growing ZnO crystal exposing a Zn polarity plane; (b) growing an n-type ZnO layer doped with n-type impurities above the surface of the substrate; (c) growing a p-type ZnO layer doped with p-type impurities above the surface of the substrate; (d) forming an active layer between the n-type ZnO layer and the p-type ZnO layer; (e) forming an n-side electrode for applying voltage to the n-type ZnO layer; and (f) forming a p-side electrode for applying voltage to the p-type ZnO layer, wherein the step (c) includes steps of: (c-1) supplying Zn and O by alternately repeating a Zn-rich condition period and an O-rich condition period; and (c-2) supplying at least one of N, P and As while Zn and O are supplied at the step (c-1).

BRIEF DESCRIPTION OF THE DRAWINGS

FIGS. 3R12 to 3R14 show reflection high-energy electron diffraction (RHEED) images of p-type ZnO crystal grown by the first embodiment method taken by irradiating an electron beam along [11-20] direction, and FIG. 3R11 shows a RHEED image of comparative ZnO crystal taken by irradiating an electron beam along [11-20] direction.

FIGS. 3R22 to 3R24 show RHEED images of p-type ZnO crystal grown by the first embodiment method taken by irradiating an electron beam along [1-100] direction, and FIG. 3R21 shows a RHEED image of comparative ZnO crystal taken by irradiating an electron beam along [1-100] direction.

FIGS. 3M12 to 3M14 and FIG. 3M24 are atomic force microscope (AFM) photographs of p-type ZnO crystal grown by the first embodiment method, and FIGS. 3M11 and 3M21 are AFM photographs of comparative ZnO crystal.

FIGS. 3R15 to 3R16 show RHEED images of p-type ZnO crystal grown by the first embodiment method taken by irradiating an electron beam along [11-20] direction, and FIG. 3R17 shows a RHEED image of comparative ZnO crystal taken by irradiating an electron beam along [11-20] direction.

FIGS. 3R25 to 3R26 show RHEED images of p-type ZnO crystal grown by the first embodiment method taken by irradiating an electron beam along [1-100] direction, and FIG. 3R27 shows a RHEED image of comparative ZnO crystal taken by irradiating an electron beam along [1-100] direction.

FIGS. 3M15, 3M16 and 3M26 are AFM photographs of p-type ZnO crystal grown by the first embodiment method, and FIGS. 3M17 and 3M27 are AFM photographs of comparative ZnO crystal.

FIGS. 10R1 and 10R2 show RHEED images of n-type ZnO crystal grown by the second embodiment method taken by irradiating an electron beam along [11-20] direction and along [1-100] direction, and FIG. 10M is an AFM photograph of n-type ZnO crystal grown by the second embodiment method.

FIGS. 11R11 to 11R15 show RHEED images of n-type ZnO crystal grown by the third preliminary experiment taken by irradiating an electron beam along [11-20] direction, and FIG. 11R16 shows a RHEED image of comparative ZnO crystal taken by irradiating an electron beam along [11-20] direction.

FIGS. 11R21 to 11R25 show RHEED images of n-type ZnO crystal grown by the third preliminary experiment taken by irradiating an electron beam along [1-100] direction, and FIG. 11R26 shows a RHEED image of comparative ZnO crystal taken by irradiating an electron beam along [1-100] direction.

FIGS. 12R1 and 12R2 show RHEED images of n-type ZnO crystal doped with Ga under a Zn-rich condition taken by irradiating an electron beam along [11-20] direction and along [1-100] direction.

FIG. 15 is a schematic cross sectional view of a light emitting device manufactured by a light emitting device manufacture method according to a fourth embodiment.

DESCRIPTION OF THE PREFERRED EMBODIMENTS

Figure 1:
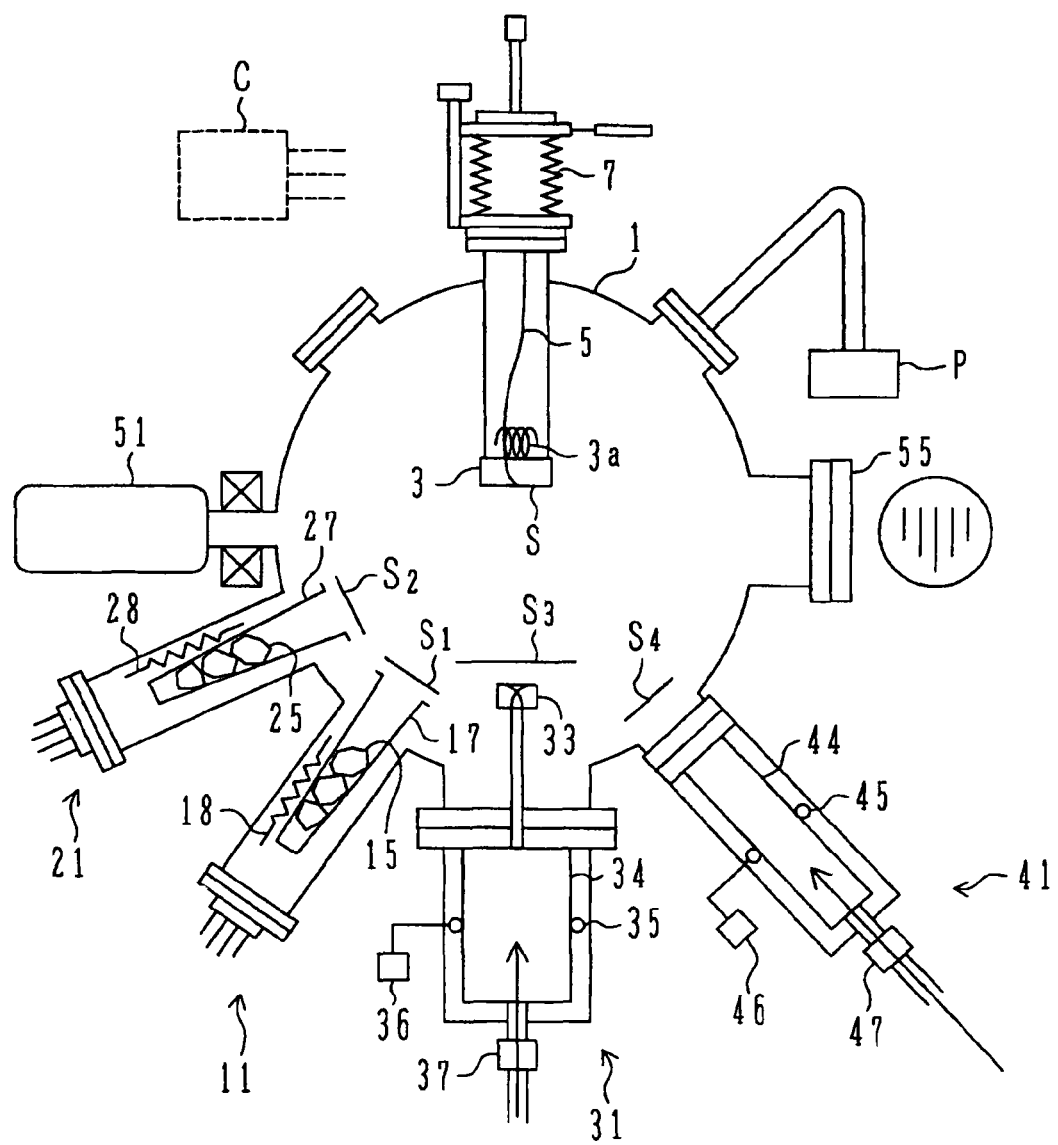
FIG. 1 is a schematic diagram showing a crystal growth system to be used by a p-type ZnO crystal growth method according to a first embodiment of the present invention.

First, with reference to FIG. 1, description will be made on an example of the crystal growth system to be used by the p-type ZnO crystal growth method according to the first embodiment of the present invention. FIG. 1 is a schematic cross sectional view showing the crystal growth system for growing crystal by high frequency plasma assisted molecular beam epitaxy (HF-RS-MBE). High frequency includes radio frequency.

A chamber 1 has a first Zn port 11 and a second Zn port 21 for supplying Zn. The first Zn port 11 is equipped with a Knudsen cell 17, a heater 18 and a shutter $S_1$. The Knudsen cell 17 accommodates Zn source material 15. The heater 18 heats the Knudsen cell 17 so that Zn is evaporated from the Zn source material 15.

The second Zn port 21 is equipped with a Knudsen cell 27, a heater 28 and a shutter $S_2$. The Knudsen cell 27 accommodates Zn source material 25. The heater 28 heats the Knudsen cell 27 so that Zn is evaporated from the Zn source material 25. The Zn source materials 15 and 25 of purity 7N may be used.

The shutter $S_1$ switches between a supply state and a non-supply state of Zn from the first Zn port 11 into the chamber 1. The shutter $S_2$ switches between a supply state and a non-supply state of Zn from the first Zn port 21 into the chamber 1.

The chamber 1 also has an O radical port 31 for supplying O radicals and an N radical port 41 for supplying N radicals. The O radical port 31 is equipped with an inductive coupled discharge tube 34, an induction coil 35 wound around the outer wall of the discharge tube 34, an orifice 33 and a shutter $S_3$. A high frequency power source 36 is connected to the induction coil 35. A flow rate controller 37 adjusts a flow rate of oxygen gas ($O_2$ gas) to be introduced into the discharge tube 34. The flow rate controller of the film forming system of the embodiment may be a mass flow controller.

A high frequency magnetic field is applied to $O_2$ gas introduced into the discharge tube 34 by using the induction coil 35, so that O radicals are generated. O radicals are supplied into the chamber 1 via the orifice 33. The shutter $S_3$ switches between a supply state and a non-supply state of O radicals from the O radical port 31 into the chamber 1.

The N radical port 41 is equipped with an inductive coupled discharge tube 44, an induction coil 45 wound around the outer wall of the discharge tube 44, and a shutter $S_4$. A high frequency power source 46 is connected to the induction coil 45. A flow rate controller 47 adjusts a flow rate of nitrogen gas ($N_2$ gas) to be introduced into the discharge tube 44.

A high frequency magnetic field is applied to $N_2$ gas introduced into the discharge tube 44 by using the induction coil 45, so that N radicals are generated. The shutter $S_4$ switches between a supply state and a non-supply state of N radicals from the N radical port 41 into the chamber 1. High frequency power source at a frequency of 13.56 MHz may be used for generating O and N radicals.

A substrate holder 3 and a heater 3a for heating the substrate holder 3 are provided in the chamber 1. The substrate holder 3 holds a substrate S which is used as an underlying base for crystal growth. As the heater 3a heats the substrate holder 3, the substrate S is heated. A temperature of the substrate S is measured with a thermocouple 5.

The substrate holder 3 is movably held by a manipulator 7 using a bellows. A vacuum pump P evacuates gas in the chamber 1. A controller C controls the heaters 18 and 28, high frequency power sources 36 and 46, flow rate controllers 37 and 47, shutters $S_1$ to $S_4$, heater 3a and vacuum pump P.

Used as the substrate S is, for example, a ZnO substrate exposing on its surface, (0001) plane of a Zn polarity plane (+c plane). By supplying Zn and O radicals to the substrate at the same time, ZnO crystal can be grown on the substrate S. By growing ZnO crystal on the Zn polarity plane, the surface of the grown crystal has the Zn polarity plane. At the same time when Zn and O radicals are supplied, N radicals are supplied to the substrate S for growing p-type ZnO crystal doped with N.

The substrate S may be an SiC substrate having an Si polarity plane, a GaN substrate having a Ga polarity plane or the like. The substrate S may be a sapphire substrate or the like. If the sapphire substrate is used, a preliminary process is executed to allow ZnO crystal with the Zn polarity to be grown.

An example of this preliminary process will be described. A sapphire substrate is washed with organic solvent. Next, phosphoric acid (86% density) and sulfuric acid (96% density) are mixed at a volume ratio of 1:3, and in the mixture solution heated to 110° C., the sapphire substrate is subjected to a wet process for 30 minutes. Thereafter, the sapphire substrate is held by the substrate holder 3 in the chamber and the inside of the chamber is made a high vacuum state of about $1.33 \times 10^{-8}$ Pa ($1 \times 10^{-10}$ Torr). After the inside of the chamber 1 is made the high vacuum state, reducing gas (e.g., hydrogen gas or the like) is introduced to execute a heat treatment, for example, at 1000° C. for about 30 minutes. The preliminary process described above is disclosed in JP-A-2002-326895, the entire contents of which are incorporated herein by reference.

A sapphire substrate having an MgO buffer layer of 3 nm or thicker grown thereon may be used as a substrate for growing ZnO crystal on the Zn polarity plane. This technique is disclosed in JP-A-2005-197410, the entire contents of which are incorporated herein by reference.

A gun 51 to be used for reflection high-energy electron diffraction (RHEED) and a screen 55 for displaying a RHEED image are mounted on the chamber 1. It is possible to judge from a RHEED image whether the surface of grown ZnO crystal is flat (two-dimensional growth occurred) or not flat (three-dimensional growth occurred). A RHEED image showing a streak pattern (line pattern) corresponds to two-dimensional growth, and a RHEED image showing a spot pattern (point pattern) corresponds to three-dimensional growth.

By controlling a temperature of the Knudsen cell 17, a flux intensity of Zn to be supplied from the first Zn port 11 can be adjusted, and by controlling a temperature of the Knudsen cell 27, a flux intensity of Zn to be supplied from the second Zn port 21 can be adjusted. When the temperatures of the Knudsen cells 17 and 27 are set as higher, the Zn flux intensities can be increased higher. A unit of the flux intensity is, for example, atoms/cm²s.

The flux intensity of O radicals can be adjusted by controlling at least one of the flow rate of $O_2$ gas to be introduced into the discharge tube 34 and the high frequency power for generating O radicals. The flux intensity of N radicals can be adjusted by controlling at least one of the flow rate of $N_2$ gas to be introduced into the discharge tube 44 and the high frequency power for generating N radicals.

A Zn flux intensity is represented by $J_{Zn}$ and an O radical flux intensity is represented by $J_O$. A coefficient (Zn sticking coefficient) indicating sticking easiness of Zn to an O-terminating plane of ZnO crystal (i.e. a growth front surface exposing O atoms) is represented by $k_{Zn}$, and a coefficient (O sticking coefficient) indicating sticking easiness of O to a Zn-terminating plane of ZnO crystal (i.e. a growth front surface exposing Zn atoms) is represented by $k_O$. A product $k_{Zn}J_{Zn}$ of the flux intensity $J_{Zn}$ and sticking coefficient $k_{Zn}$ of Zn corresponds to the number of Zn atoms sticked per a unit area of the substrate S and per a unit time, and a product $k_O J_O$ of the flux intensity $J_O$ and sticking coefficient $k_O$ of O corresponds to the number of O atoms sticked per a unit area of the substrate S and per a unit time. The condition that the product $k_{Zn}J_{Zn}$ is equal to the product $k_O J_O$ is called a stoichiometry condition.

A ratio of $J_O/J_{Zn}$ of the O radical flux intensity to the Zn flux intensity is defined as a flux ratio. A condition that a flux ratio is larger than a flux ratio under the stoichiometry condition is an O-rich film forming condition (called an O-rich condition), and a condition that a flux ratio is smaller than a flux ration under the stoichiometry condition is a Zn-rich film forming condition (called a Zn-rich condition).

If a ZnO re-vaporization rate can be neglected, a growth rate $G_{ZnO}$ of ZnO crystal is given by the following equation:

$$G_{ZnO} = [(k_{Zn}J_{Zn})^{-1} + (k_O J_O)^{-1}]^{-1} \quad (1)$$

The ZnO re-vaporization rate can be neglected at a substrate temperature of 800° C. or lower.

The Zn flux intensity satisfying the stoichiometry condition can be calculated in the following way by using the equation (1). A growth rate of ZnO crystal is measured by changing the Zn flux intensity under the condition that the O radical flux intensity is constant. In accordance with a dependency of the measured growth rate upon the Zn flux intensity, the Zn sticking coefficient $k_{Zn}$ and $k_O J_O$ can be calculated from the equation (1). In accordance with the calculated $k_{Zn}$ and $k_O J_O$, the Zn flux intensity satisfying the stoichiometry condition can be obtained.

Next, description will be made on the researches on the condition suitable for two-dimensionally growing impurity non-doped ZnO crystal with an exposed Zn polarity plane. The researches are disclosed, for example, in H. Kato, M. Sano, K. Miyamoto, and T. Yao, "Homoepitaxial Growth of High-Quality Zn-Polar ZnO Films by Plasma-Assisted Molecular Beam Epitaxy", Jpn. J. Appl. Phys. 42, L1002 (2003), the entire contents of which are incorporated herein by reference, and in H. Kato, M. Sano, K. Miyamoto, and T. Yao, "High-quality ZnO epilayers grown on n-plane ZnO substrates by plasma-assisted molecular beam epitaxy", J. Crystal Growth 265, 375 (2004), the entire contents of which are incorporated herein by reference.

It can be understood from these researches that if impurity is not doped, the O-rich condition is suitable for two-dimensionally growing ZnO crystal on an exposed Zn polarity plane. A method of determining the stoichiometry condition is described in a said paper written in J. Crystal Growth.

Next, with reference to FIG. 5, description will be made on the first preliminary experiment on p-type ZnO crystal growth. In the first preliminary experiment, studies were made on how an amount of N doped in ZnO crystal changes and how a smoothness of a ZnO crystal surface changes with a change in the flux ratio.

The flux ratio was changed by increasing and decreasing the Zn flux intensity at a constant O radical flux intensity. The O radical beam generation conditions were an $O_2$ gas flow rate of 2 sccm, a high frequency power of 300 W and a constant N radical flux intensity. The N radical beam generation conditions were an $N_2$ gas flow rate of 2 sccm and a high frequency power of 300 W. Used as the underlying substrate was a sapphire substrate subjected to the preliminary process allowing to grow ZnO crystal on an exposed Zn polarity plane. The surface of the sapphire substrate on which ZnO was grown was (0001).

Figure 5:
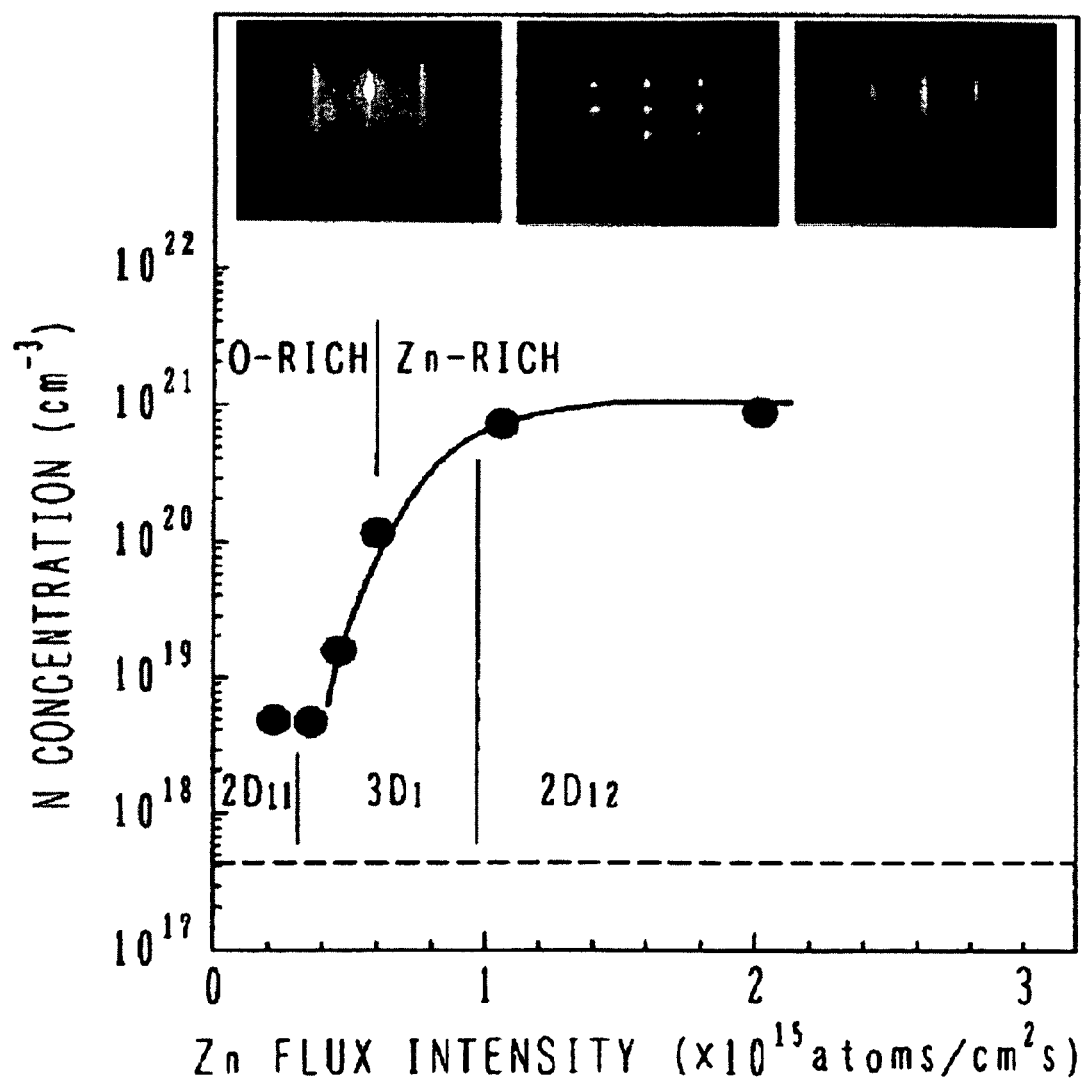
FIG. 5 is a graph showing an N concentration to be used for describing a first preliminary experiment.

The abscissa of the graph shown in FIG. 5 represents a Zn flux intensity (in the unit of $10^{15}$ atoms/cm$^2$s) and the ordinate represents an N concentration (in the unit of cm$^{-3}$). A concentration of about $4.5 \times 10^{17}$ cm$^{-3}$ is a lower limit of a detectable N concentration.

The growth condition at the Zn flux intensity of about $0.6 \times 10^{15}$ atoms/cm$^2$s corresponds to the stoichiometry condition. The region where the Zn flux intensity is smaller than about $0.6 \times 10^{15}$ atoms/cm$^2$s corresponds to the O-rich condition, and the region where the Zn flux intensity is larger than about $0.6 \times 10^{15}$ atoms/cm$^2$s corresponds to the Zn-rich condition.

In the region (this region is called a region $2D_{11}$) where the Zn flux intensity is smaller than about $0.3 \times 10^{15}$ atoms/cm$^2$s, N-doped ZnO crystal was grown two-dimensionally. Of RHEED images shown in an upper area of the graph, the leftmost image is a diffraction image of the sample formed under the condition of this region. The RHEED image has a streak pattern indicating two-dimensional (2D) growth. This matches the conventional knowing that two-dimensional growth is likely to occur under the O-rich condition. In the region $2D_{11}$, a concentration of doped N was only about $5 \times 10^{18}$ cm$^{-3}$. The N concentration is desired to be $1 \times 10^{19}$ cm$^{-3}$ and over in order to use ZnO crystal as the material of a light emitting device.

In the region (this region is called a region $3D_1$) where the Zn flux intensity is about $0.3 \times 10^{15}$ atoms/cm$^2$s or larger and about $1 \times 10^{15}$ atoms/cm$^2$s or smaller, N-doped ZnO crystal was grown three-dimensionally. Of RHEED images shown in the upper area of the graph, the center image is a diffraction image of the sample formed under the condition of this region. The RHEED image has a spot pattern indicating three-dimensional (3D) growth. In the region $3D_1$, as the Zn flux intensity increased, a concentration of doped N increased.

In the region (this region is called a region $2D_{12}$) where the Zn flux intensity is about $1 \times 10^{15}$ atoms/cm$^2$s or larger, N-doped ZnO crystal was again grown two-dimensionally. Of RHEED images shown in an upper area of the graph, the rightmost image is a diffraction image of the sample formed under the condition of this region. The RHEED image has a streak pattern indicating two-dimensional (2D) growth. In the region $2D_{12}$, a concentration of doped N was approximately constant. In the region $2D_{12}$, a concentration of N reached about $8 \times 10^{20}$ cm$^{-3}$.

It has been found from the first preliminary experiment that if N is doped, ZnO crystal can be grown two-dimensionally even under the Zn-rich condition. It has also been found that N can be doped more by two-dimensional growth under the Zn-rich condition than two-dimensional growth under the O-rich condition.

As above, in the region $2D_{12}$, two-dimensional growth occurs and can dope N more than growth under the O-rich condition. However, the concentration of doped N is approximately constant. There is a case in which the N concentration is desired lower than the concentration obtained in the region $2D_{12}$ (e.g., about $1 \times 10^{20}$ cm$^{-3}$).

Next, with reference to FIG. 6, description will be made on the second preliminary experiment on p-type ZnO crystal growth. In the second preliminary experiment, studies were made on how an amount of N doped in ZnO crystal changes and how a smoothness of a ZnO crystal surface changes with a change in the N radical flux intensity at a constant flux ratio.

The Zn flux intensity was set to $2 \times 10^{15}$ atoms/cm$^2$s. The O radical beam generation conditions were an $O_2$ gas flow rate of 2 sccm and a high frequency power of 300 W. Selected as the flux ratio of the second preliminary experiment is the flux ratio in the region $2D_{12}$ where the two-dimensional growth occurs under the Zn-rich condition in the first preliminary experiment.

Of the N radical beam generation conditions, the $N_2$ gas flow rate was set to 0.5 sccm, and the high frequency power was changed. Used as the underlying substrate was a sapphire substrate subjected to the preliminary process allowing to grow ZnO crystal on an exposed Zn polarity plane. The surface of the sapphire substrate on which ZnO was grown was (0001). ZnO crystal was grown to a thickness of about 1 μm.

Figure 6:
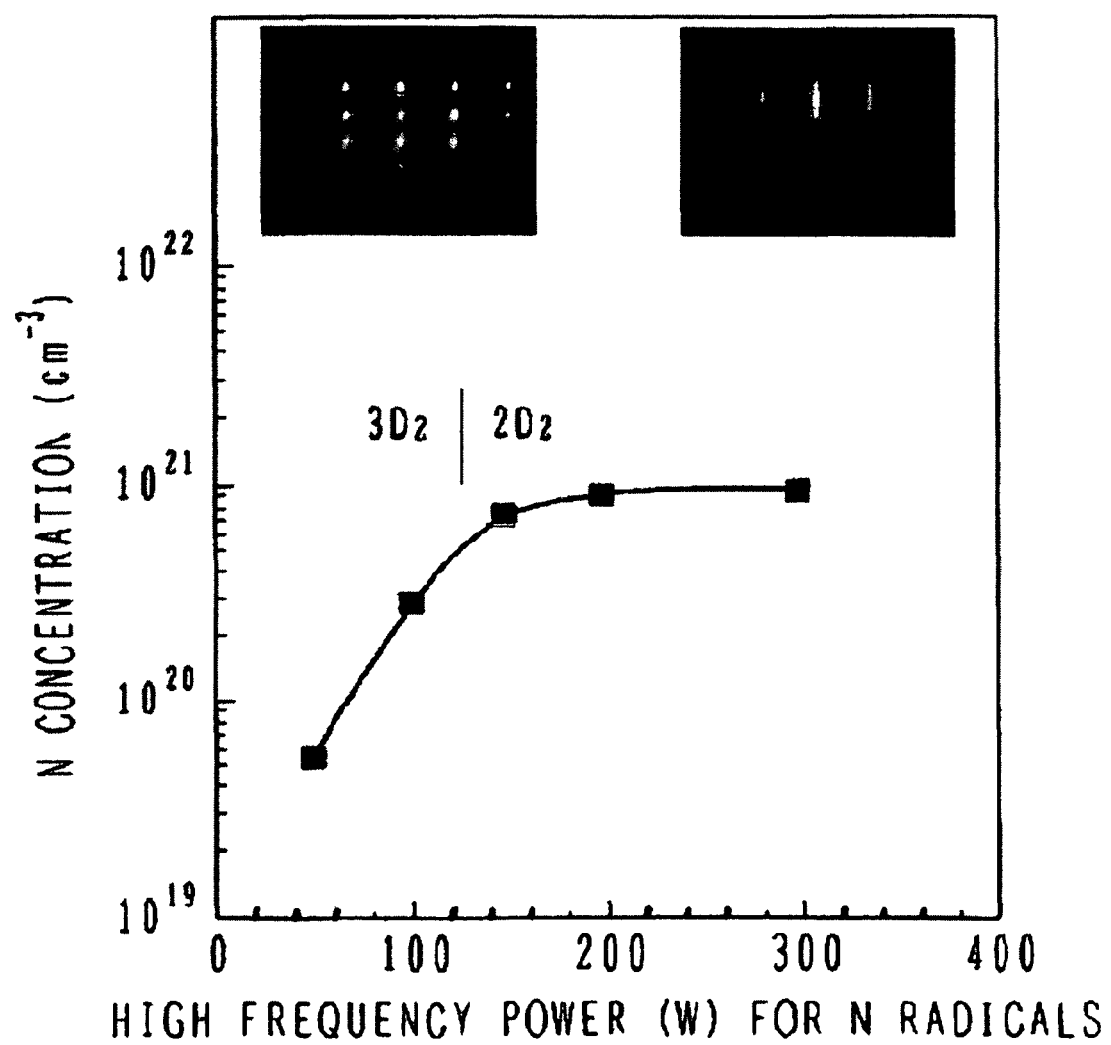
FIG. 6 is a graph showing an N concentration to be used for describing a second preliminary experiment.

The abscissa of the graph shown in FIG. 6 represents a high frequency power (in the unit of W) for generating N plasma, and the ordinate represents an N concentration (in the unit of cm$^{-3}$). In the region (this region is called a region $2D_2$) where the high frequency power is higher than 120 W, ZnO crystal grows two-dimensionally, and in the region (this region is called a region $3D_2$) where the high frequency power is lower than 120 W, ZnO crystal grew three-dimensionally.

Of the RHEED images shown in an upper area of the graph, the right image shows a diffraction image of a sample formed under the conditions of the region $2D_2$. The RHEED image has a streak pattern indicating two-dimensional growth. Of the RHEED images shown in the upper area of the graph, the left image shows a diffraction image of a sample formed under the conditions of the region $3D_2$. The RHEED image has a spot pattern indicating three-dimensional growth.

As the high frequency power is lowered, the concentration of doped N decreased. However, in the two-dimensional growth region $2D_2$, the N concentration reduces not so much even the high frequency power is lowered. In the three-dimensional growth region $3D_2$, a slope of reduction in the N concentration with reduction in the high frequency power is steeper than in the region $2D_2$.

The region where the N concentration is higher than about $6 \times 10^{20}$ cm$^{-3}$ is the two-dimensional growth region $2D_2$, and the region where the N concentration is lower than about $6 \times 10^{20}$ cm$^{-3}$ is the three-dimensional growth region $3D_2$.

It has been found from the second preliminary experiment that as the high frequency power for generating N radicals is lowered, the concentration of doped N can be reduced. However, a reduction amount in the N concentration is not so large in the range of the high frequency power allowing two-dimensional growth. A p-type ZnO crystal growth method is desired which can two-dimensionally grow ZnO crystal on the Zn polarity plane and can have a lower N concentration (e.g., about $1 \times 10^{20}$ cm$^{-3}$).

Figure 2A:
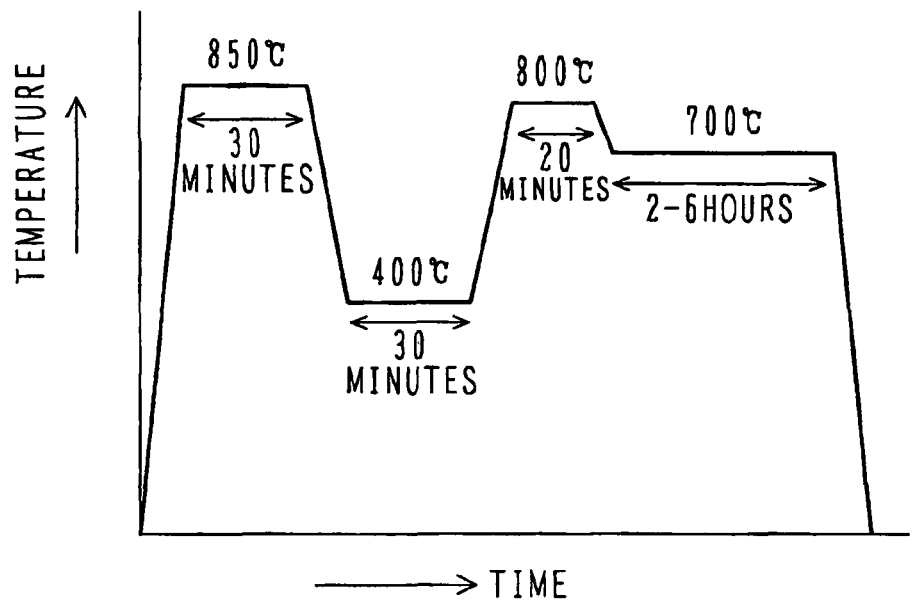
FIG. 2A is a graph showing a change in a substrate temperature with time during the whole processes of the p-type ZnO crystal growth method of the first embodiment.
Figure 2B:
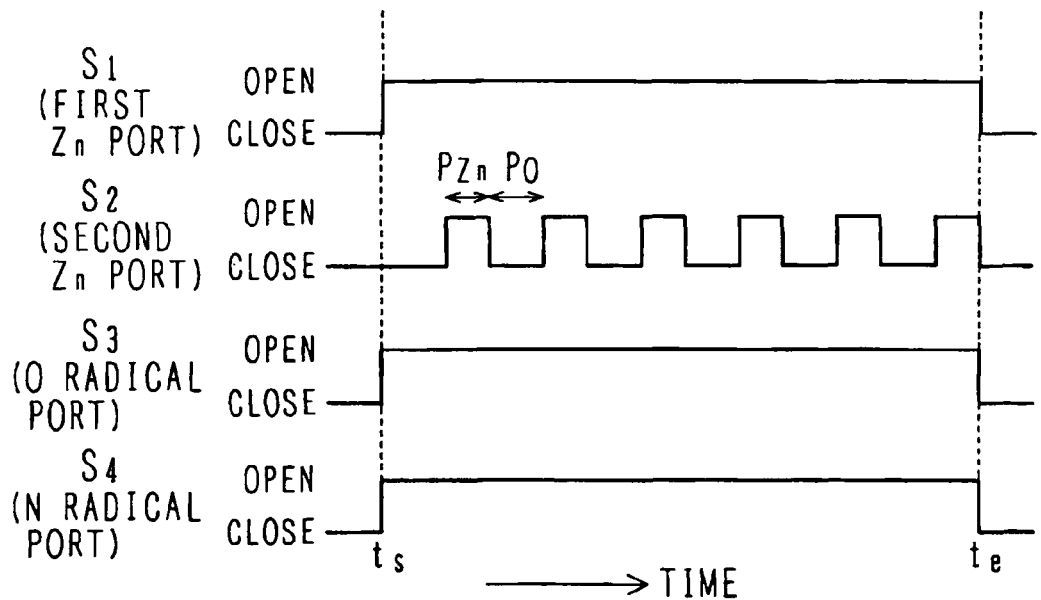
FIG. 2B is a timing chart illustrating a shutter control during the p-type ZnO crystal growth process of the first embodiment.

Next, with reference to FIGS. 2A and 2B, description will be made on the growth method for p-type ZnO crystal according to the first embodiment. FIG. 2A is a graph showing a change in a substrate temperature with time during the whole processes of ZnO crystal growth, and FIG. 2B is a timing chart illustrating shutter control in a growth process for N-doped p-type ZnO crystal.

First, a ZnO substrate exposing the Zn polarity plane is held by the substrate holder 3 of the film forming system shown in FIG. 1. Next, as shown in FIG. 2A, thermal cleaning is performed, for example, at a substrate temperature of 850° C. for 30 minutes.

After the thermal cleaning, a buffer layer of ZnO not doped with impurities is grown on the substrate surface. During the growth of the buffer layer, a Zn deposition rate is set for example to 0.01 nm/s. The Zn deposition rate corresponds to the Zn flux intensity, and the Zn deposition rate of 0.01 nm/s corresponds to the Zn flux intensity of $0.07 \times 10^{15}$ atoms/cm$^2$s.

During the period while the buffer layer is grown, the shutter $S_1$ of the first Zn port 11 is opened and the shutter $S_2$ of the second Zn port 12 is closed. Zn is supplied from the first Zn port 11. A temperature of the Knudsen cell 17 is controlled so that the deposition rate of Zn supplied from the first Zn port 11 is maintained at 0.01 nm/s.

During the growth of the buffer layer, the O radical beam generation conditions are an $O_2$ gas flow rate of 2 sccm and a high frequency power of 300 W, for example. Growth is performed, for example, at a substrate temperature of 400° C. for 30 minutes. In this case, the flux ratio satisfies the O-rich condition suitable for two-dimensional growth.

After the buffer layer is formed, the buffer layer is annealed, for example, at a substrate temperature of 800° C. for 20 minutes. After annealing the buffer layer, N-doped ZnO crystal is grown, for example, at a substrate temperature of 700° C. for 2 to 6 hours.

Next, with reference to FIG. 2B, detailed description will be made on a process of growing N-doped p-type ZnO crystal. The O radical beam generation conditions are an $O_2$ gas flow rate of 2 sccm and a high frequency power of 300 W, for example. The shutter $S_3$ of the O radical port 31 is opened at a time $t_s$ and closed at a time $t_e$. During the period from the time $t_s$ and time $t_e$, O radicals are supplied to the substrate S.

The shutter $S_1$ of the first Zn port 11 is opened at the time $t_s$ and closed at the time $t_e$. During the period from the time $t_s$ and time $t_e$, Zn is continuously supplied to the substrate S from the first Zn port 11.

During the period from the time $t_s$ to time $t_e$, a period $P_{Zn}$ while the shutter $S_2$ of the second Zn port 21 is opened and a period $P_O$ while the shutter $S_2$ is closed are alternately repeated. With this operation, during the period from the time $t_s$ to time $t_e$, Zn is supplied intermittently to the substrate S from the second Zn port 21.

While the shutter $S_1$ of the first Zn port 11 is opened and the shutter $S_2$ of the second Zn port 21 is closed, a temperature of the Knudsen cell 17 is controlled so that the deposition rate of Zn supplied from the first Zn port 11 is set for example to 0.01 nm/s. While both the shutters $S_1$ and $S_2$ are opened, a temperature of the Knudsen cell 27 is controlled so that the deposition rate of Zn supplied from the first Zn port 11 and second Zn port 21 is set for example to 0.28 nm/s.

The Zn deposition rate of 0.01 nm/s corresponds to the Zn flux intensity of $0.07 \times 10^{15}$ atoms/cm$^2$s, and the Zn deposition rate of 0.28 nm/s corresponds to the Zn flux intensity of $1.8 \times 10^{15}$ atoms/cm$^2$s. While Zn is supplied only from the first Zn port 11, the flux ratio satisfies the O-rich condition, whereas while Zn is supplied from both the first Zn port 11 and second Zn port 21, the flux ratio satisfies the Zn-rich condition. By controlling the shutters $S_1$ and $S_2$ in the way described above, alternately repeated are the period $P_{Zn}$ during the Zn-rich condition and the period $P_O$ during the O-rich condition.

A length (time duration) of one period $P_{Zn}$ (period under the Zn-rich condition) corresponds to a thickness of a ZnO crystal layer deposited during this period. The thickness of the ZnO layer deposited during one period $P_{Zn}$ is in the range of 0.5 nm to 20 nm. A length (time duration) of one period $P_O$ (period under the O-rich condition) corresponds to a thickness of a ZnO crystal layer deposited during this period. The thickness of the ZnO layer deposited during one period $P_O$ is in the range of 0.25 nm to 2 nm.

The N radical beam generation conditions are an $N_2$ gas flow rate of 0.5 sccm and a high frequency power of 100 W, for example. The shutter $S_4$ of the N radical port 41 is opened at the time $t_s$ and closed at the time $t_e$. During the period from the time $t_s$ to time $t_e$, N radicals are supplied to the substrate S.

Next, description will be made on an experiment of growing p-type ZnO crystal by the embodiment method. In this experiment, a thickness of crystal to be grown during one period under the O-rich condition was fixed to 1 nm and a thickness of crystal to be grown during one period under the Zn-rich condition was changed to 0.5 nm, 1 nm, 2 nm, 4 nm and 8 nm to manufacture five types of p-type ZnO crystal. Samples having thicknesses of 0.5 nm, 1 nm, 2 nm, 4 nm and 8 nm of crystal to be grown during one period under the Zn-rich condition are called, S0.5, S1, S2, S4 and S8.

Crystal growth during one period under the O-rich condition and crystal growth during a next one period under the Zn-rich condition are collectively called one cycle. Samples S0.5, S1, S2, S4 and S8 were grown by 320 cycles, 300 cycles, 200 cycles, 120 cycles and 72 cycles, respectively.

The growth speed (an average growth speed of p-type ZnO crystal layer) of the samples S0.5, S1, S2, S4 and S8 were 100 nm/h, 140 nm/h, 160 nm/h, 210 nm/h and 250 nm/h, respectively.

In this experiment, comparative samples were also manufactured including ZnO crystal two-dimensionally grown under the O-rich condition without doping impurities (this is called Sca) and ZnO crystal three-dimensionally grown under the Zn-rich condition by doping N (this is called Scb). The growth rate of ZnO crystal during manufacture of the samples Sca and Scb were 130 nm/h and 440 nm/h, respectively.

Each sample was measured through reflection high-energy electron diffraction (RHEED), and the surface of each sample was observed with an atomic force microscope (AFM). FIGS. 3R11 to 3R17 show reflection high-energy electron diffraction (RHEED) images of the samples Sca, S0.5, S1, S2, S4, S8 and Scb taken by irradiating an electron beam along [11-20] direction. FIGS. 3R21 to 3R27 show RHEED images of the samples Sca, S0.5, S1, S2, S4, S8 and Scb taken by irradiating an electron beam along [1-100] direction.

Figure 12M:
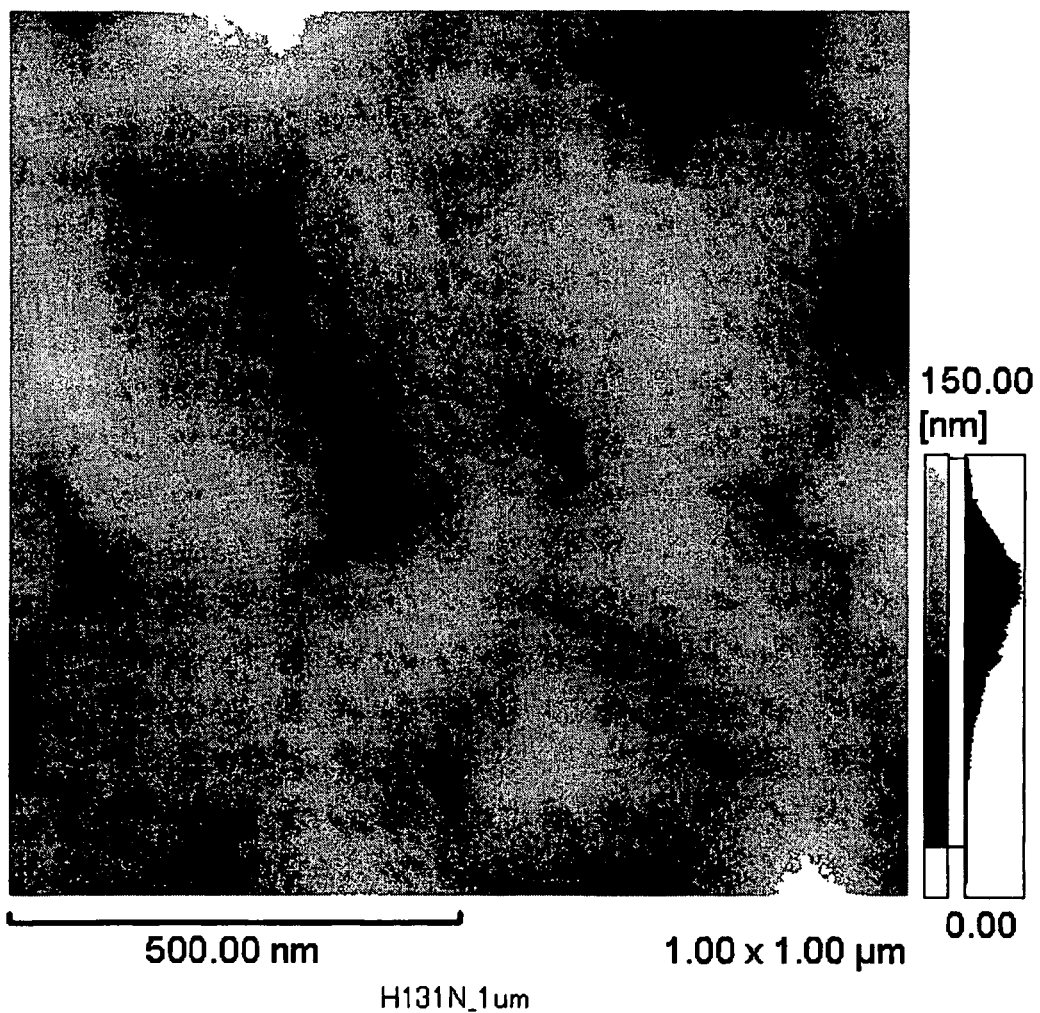
FIG. 12M is an AFM photograph of n-type ZnO crystal doped with Ga under a Zn-rich condition.
Figure 13:
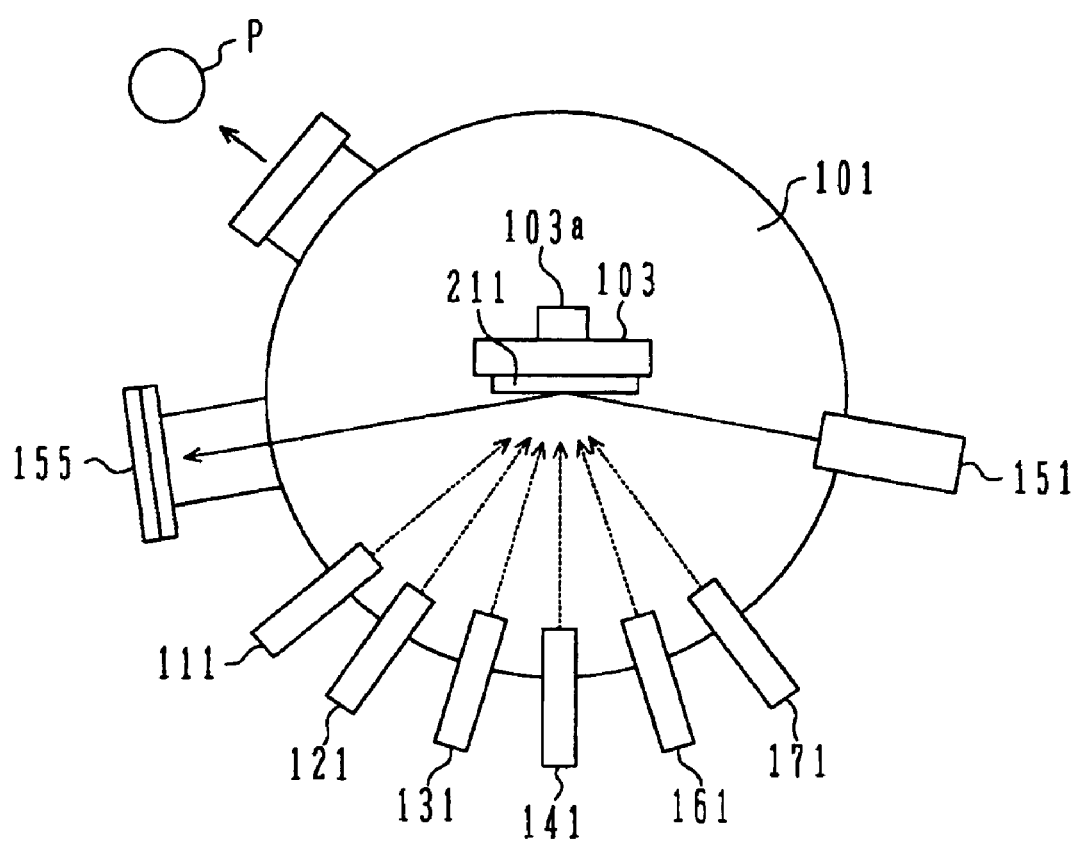
FIG. 13 is a schematic diagram showing a crystal growth system to be used by a light emitting device manufacture method according to a third embodiment.
Figure 14A:
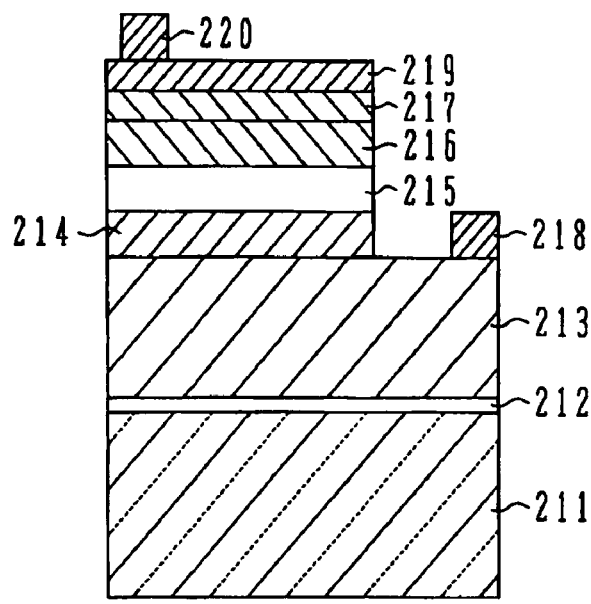
FIG. 14A is a schematic cross sectional view of a light emitting device manufactured by the light emitting device manufacture method of the third embodiment.
Figure 14B:
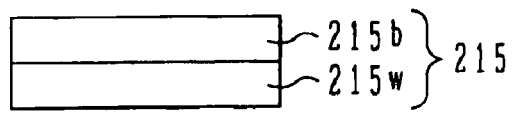
FIGS. 14B and 14C are schematic cross sectional views showing examples of an active layer structure.
Figure 14C:
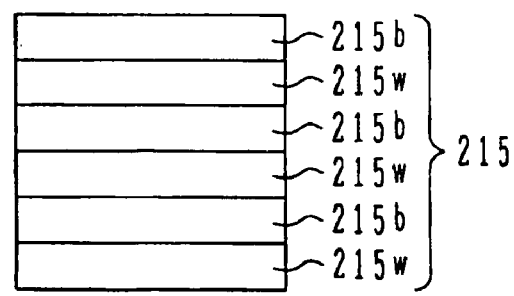
Figure 15:
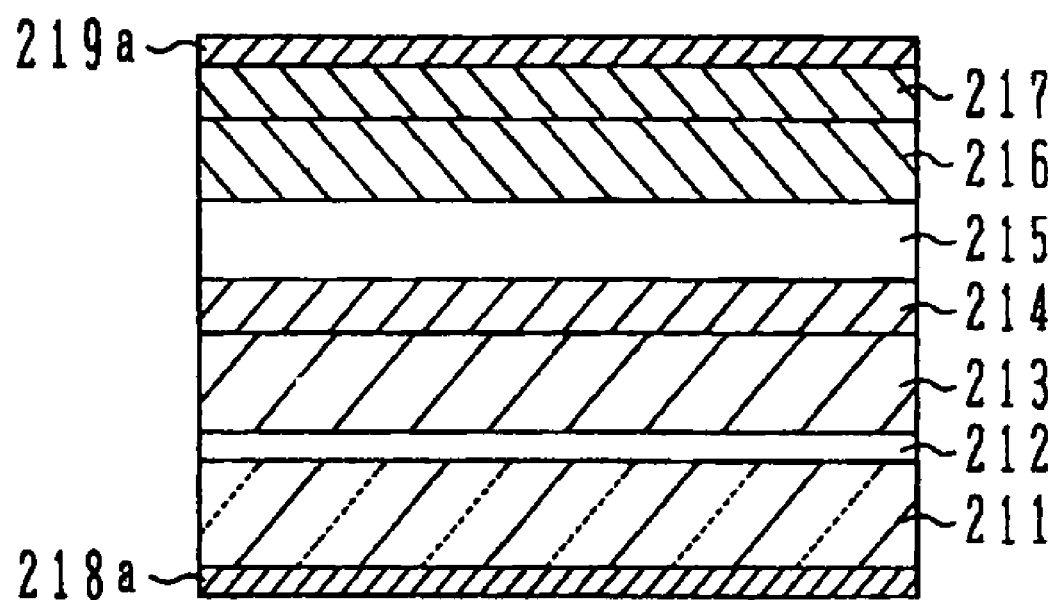

AFM photographs are shown in FIGS. 3M11 and 3M21 for the sample Sca, in FIG. 3M12 for the sample S0.5, in FIG. 3M13 for the sample S1, in FIGS. 3M14 and 3M24 for the sample S2, in FIG. 3M15 for the sample S4, in FIGS. 3M16 and 3M26 for the sample S8, and in FIGS. 3M17 and 3M27 for the sample Scb. FIGS. 3M11, 3M14, 3M16 and 3M17 have a magnification factor larger than that of FIGS. 3M21, 3M24, 3M26 and 3M27, respectively.

RHEED images of the samples S0.5, S1, S2, S4 and S8 all showed the streak pattern. It can be understood from this that the samples S0.5, S1, S2, S4 and S8 are all two-dimensionally grown.

A RHEED image of the sample Sca shows the stream pattern and that of the sample Scb shows the spot pattern. It can be understood from this that the sample Sca was two-dimensionally grown and the sample Scb was three-dimensionally grown.

A root-mean-square (RMS) value of a surface roughness of each sample was obtained on the basis of observation with AFM. An RMS value of the sample S0.5 was 0.46 nm and that of the sample S1 was 0.29 nm. An RMS value of the sample S2 was 0.57 nm obtained by measurement of the photograph of FIG. 3M14, and 0.70 nm obtained by measurement of the photograph of FIG. 3M24. An RMS value of the sample S4 was 0.51 nm. An RMS value of the sample S8 was 0.46 nm obtained by measurement of the photograph of FIG. 3M16, and 0.58 nm obtained by measurement of the photograph of FIG. 3M26.

An RMS value of the sample Sca was 0.16 nm obtained by measurement of the photograph of FIG. 3M11 and 0.54 nm obtained by measurement of the photograph of FIG. 3M21. An RMS value of the sample Scb was 38.4 nm obtained by measurement of the photograph of FIG. 3M17 and 46.5 nm obtained by measurement of the photograph of FIG. 3M27.

If the RMS value of the surface roughness obtained through observation with AFM is larger than 2 nm, it can be judged that ZnO crystal grows three-dimensionally, whereas if the RMS value is 2 nm or smaller, it can be judged that ZnO crystal grows two-dimensionally. Since the samples Sca, S0.5, S1, S2, S4 and S8 have all the RMS value of 2 nm or smaller, it can be judged that ZnO crystal grows two-dimensionally. Since the RMS value of the sample Scb is larger than 2 nm, it is judged that ZnO crystal grows three-dimensionally.

Next, with reference to FIG. 4, description will be made on measurement results of concentrations of N doped in the samples S0.5, S1, S2, S4 and S8. The measurements were conducted by using secondary ion mass spectroscopy (SIMS).

For the purposes of comparison, the N concentration was measured also for ZnO crystal two-dimensionally grown under the Zn-rich condition by doping N (this is called a sample Scc), ZnO crystal two-dimensionally grown under the O-rich condition by doping N (this is called a sample Scd), and ZnO crystal two-dimensionally grown under the O-rich condition without doping impurities (this is called a sample Sce).

Figure 4:
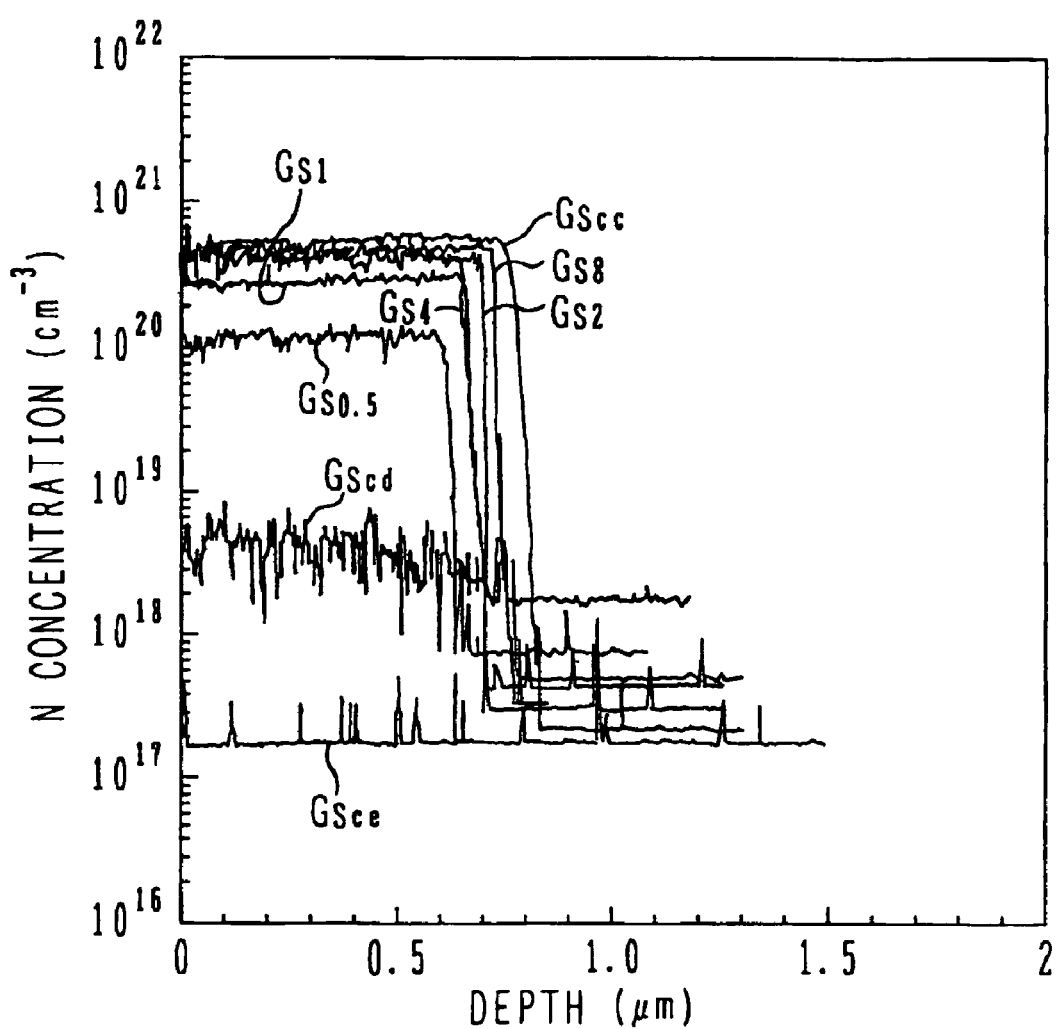
FIG. 4 is a graph showing N concentration distributions of p-type ZnO crystal grown by the first embodiment method and comparative ZnO crystal.

FIG. 4 is a graph showing N concentration distributions along a thickness (depth) direction of each sample. The abscissa represents a depth from the sample surface (in the unit of μm) and the ordinate represents an N concentration (in the unit of $cm^{-3}$). In FIG. 4, graphs $G_{S0.5}$, $G_{S1}$, $G_{S2}$, $G_{S4}$ $G_{S8}$, $G_{Scc}$, $G_{Scd}$, and $G_{Sce}$ indicate N concentration distributions of the samples S0.5, S1, S2, S4, S8, Scc, Scd and Sce. In the samples doped with N, a region (near 0.6 μm to 0.8 μm) where the N concentration along the depth direction lowers sharply corresponds to a boundary portion between the p-type ZnO crystal layer and underlying layer.

In the samples S0.5, S1, S2, S4 and S8 of the embodiment, N is doped at generally a uniform concentration along the depth direction of the p-type ZnO crystal layer.

The N concentration of the p-type ZnO crystal layer of each sample manufactured by the embodiment method is distributed in a range lower than the N concentration of the p-type ZnO crystal layer (sample Scc) two-dimensionally grown under the Zn-rich condition by doping N and higher than the N concentration of the p-type ZnO crystal layer (sample Scd) two-dimensionally grown under the O-rich condition by doping N. In each sample manufactured by the embodiment method, there is a tendency that the N concentration of the ZnO crystal layer becomes high as the layer grown during one period under the Zn-rich condition becomes thick.

The N concentration of the sample S8 having the highest N concentration among the samples of the embodiment is the same degree as the N concentration of the sample Scc grown under the Zn-rich condition by doping N. The N concentration of the sample S0.5 having the lowest N concentration among the samples of the embodiment is about $1\times10^{20}$ $cm^{-3}$. As above, it has been found that a low N concentration such as $1\times10^{20}$ $cm^{-3}$ can also be obtained.

As described above, by using the p-type ZnO crystal growth method of the first embodiment, N-doped p-type ZnO crystal can be two-dimensionally grown and N can be doped at a desired concentration.

A concentration of doped N can be controlled easily by changing a ratio between a thickness of a layer grown during one period under the Zn-rich condition and a thickness of a layer grown during one period under the O-rich condition. A crystal growth rate can be increased more as compared to doping N only under the O-rich condition.

Replacement of O sites of ZnO crystal with N contributes to an increase in p-type carriers. This may be ascribed to that N becomes hard to be doped in ZnO crystal under the O-rich condition because of replacement of O sites. As p-type impurities of ZnO crystal, P or As may be used in addition to N. Since P and As also replaces O sites, it can be considered that P and As are difficult to be doped in ZnO crystal under the O-rich condition, similar to N. With the embodiment method repeating the Zn- and O-rich conditions, it is expected that it becomes easy to dope also P and As.

In the first embodiment, although N is continuously supplied, N may be supplied intermittently to grow p-type ZnO crystal.

The conditions of growing p-type ZnO crystal are not limited to those of the first embodiment. For example, a substrate temperature during p-type ZnO crystal growth by molecular beam epitaxy may be in a range of 500° C. to 1000° C. The Zn flux intensity and O flux intensity are not limited to those values of the first embodiment.

In the first embodiment, although p-type ZnO crystal is grown by high frequency plasma assisted molecular beam epitaxy, the crystal growth method is not limited to molecular beam epitaxy. For example, metal organic chemical vapor deposition (MOCVD) may also be used.

In the first embodiment, although N radicals are supplied as a nitrogen source, other nitrogen sources such as $N_2O$, $NO_2$ and $NH_3$ may also be used.

Next, with reference to FIG. 7, description will be made on an example of the crystal growth system to be used by the n-type ZnO crystal growth method according to the second embodiment of the present invention. Similar to the film forming system (refer to FIG. 1) for the p-type ZnO crystal used in the first embodiment, the film forming system uses a film forming system for growing crystal by high frequency plasma assisted molecular beam epitaxy.

In this film forming system, the chamber 1 has a Ga port 61 for supplying Ga, instead of the N radical port 41 of the film forming system for p-type ZnO crystal shown in FIG. 1. The Ga port 61 has a Knudsen cell 67, a heater 68 and a shutter $S_6$. The Knudsen 67 accommodates Ga source material 65. As the heater 68 heats the knudsen cell 67, Ga evaporates from the Ga source material 65. The shutter $S_6$ switches between a supply state and a non-supply state of Ga from the Ga port 61 into the chamber 1. The heater 68 and shutter $S_6$ are controlled by a controller C. The other structures are similar to those of the film forming system for p-type ZnO crystal used in the first embodiment.

As the substrate S, a substrate similar to that used for growing p-type ZnO crystal can be used. For example, a ZnO substrate is used which exposes (0001) plane (+c plane) of the Zn polarity plane on the surface. For example, a sapphire substrate or the like may also be used which was subjected to the preliminary process for allowing ZnO crystal to be grown on the Zn polarity plane.

By supplying Ga to the substrate S at the same time when Zn and O radicals are supplied, it becomes possible to grow n-type ZnO crystal doped with Ga. By controlling a temperature of the Knudsen cell 67, a flux intensity of Ga to be supplied from the Ga port 61 can be adjusted. As the temperature of the Knudsen cell 67 is set higher, the Ga flux intensity can be made higher.

Next, description will be made on the researches on doping Ga in ZnO crystal grown on the O polarity surface. The researches are disclosed, for example, in H. Kato, M. Sano, K. Miyamoto, and T. Yao, "Growth and characterization of Ga-doped ZnO layers on a-plane sapphire substrates grown by molecular beam epitaxy", J. Crystal Growth 237-239, 538 (2002), the entire contents of which are incorporated herein by reference, and in Kato, Miyamoto and Sano "Growth of MBE-ZnO on c-plane sapphire and ZnO substrates—High quality of crystal and n-type doping—", the Japan Society of Applied Physics, Crystal Engineering Sub-committee, written in 120-th Study Forum Text, the entire contents of which are incorporated herein by reference.

These researches have found that Ga can be doped at a concentration in the order of $10^{17}$ cm$^{-3}$ to $10^{20}$ cm$^{-3}$ into ZnO crystal to be grown on the O polarity plane, and a carrier concentration approximately equal to the concentration of doped Ga can be obtained.

Next, with reference to FIGS. 9 and 11, description will be made on a third preliminary experiment on n-type ZnO crystal growth. In this preliminary experiment, studies were conducted on a change behavior of a smoothness of a ZnO crystal surface grown on the Zn polarity surface, an amount of Ga doped in ZnO crystal, and a carrier concentration (electron concentration) of ZnO crystal doped with Ga, by changing a Ga flux intensity at the constant flux ratio.

The Zn flux intensity corresponds to a deposition rate of Zn on the substrate. In the third preliminary experiment, a Zn deposition rate was set to 0.04 nm/s. The deposition rate of 0.04 nm/s corresponds to a Zn flux intensity of $0.26 \times 10^{15}$ atoms/cm$^2$s. The O radical beam generation conditions were an O$_2$ gas flow rate of 3 sccm and a high frequency power of 300 W. A flux ratio in this case satisfies the O-rich condition.

By changing the Ga Knudsen cell temperature, the Ga flux intensity was changed. As the underlying substrate, a sapphire substrate was used which was subjected to the preliminary process for allowing to grow ZnO crystal exposing the Zn polarity plane. The surface of the sapphire substrate with grown Zn crystal is (0001) plane. A substrate temperature during ZnO crystal growth was set to 700° C.

Five types of samples were manufactured at Ga Knudsen cell temperatures of 400° C., 430° C., 460° C., 500° C. and 550° C. The samples manufactured at Ga Knudsen cell temperatures of 400° C., 430° C., 460° C., 500° C. and 550° C. are called S400, S430, S460, S500 and S550, respectively. For the purposes of comparison, a sample Scf was also manufactured by growing ZnO crystal exposing the O polarity plane at a Ga Knudsen cell temperature of 500° C.

FIGS. 11R11 to 11R16 show RHEED images of the samples S400, S430, S460, S500, S550 and Scf taken by irradiating an electron beam along [11-20] direction. FIGS. 11R21 to 11R26 show RHEED images of the samples S400, S430, S460, S500, S550 and Scf taken by irradiating an electron beam along [1-100] direction.

The samples S400, S430 and S460 at the Ga Knudsen cell temperature of 460° C. or lower show the streak patterns, indicating two-dimensional growth. The sample S500 shows a spot-like pattern, indicating three-dimensional growth. The sample S550 shows a ring-like pattern, indicating polycrystallization. The sample Scf grown on the O polarity plane shows the streak pattern even at a Ga knudsen cell temperature of 500° C., indicating two-dimensional growth.

It has been found that two-dimensional growth is hard to occur as the Ga Knudsen cell temperature is raised (as the Ga flux intensity is increased), during growth on the Z polarity plane under the O-rich condition.

Next, description will be made on a relation between a concentration of doped Ga and a carrier concentration (electron concentration) of the samples S400, S430, S460, S500 and S550. A concentration of doped Ga was measured by secondary ion mass spectroscopy (SIMS). A carrier concentration was obtained through Hall measurements.

Figure 9:
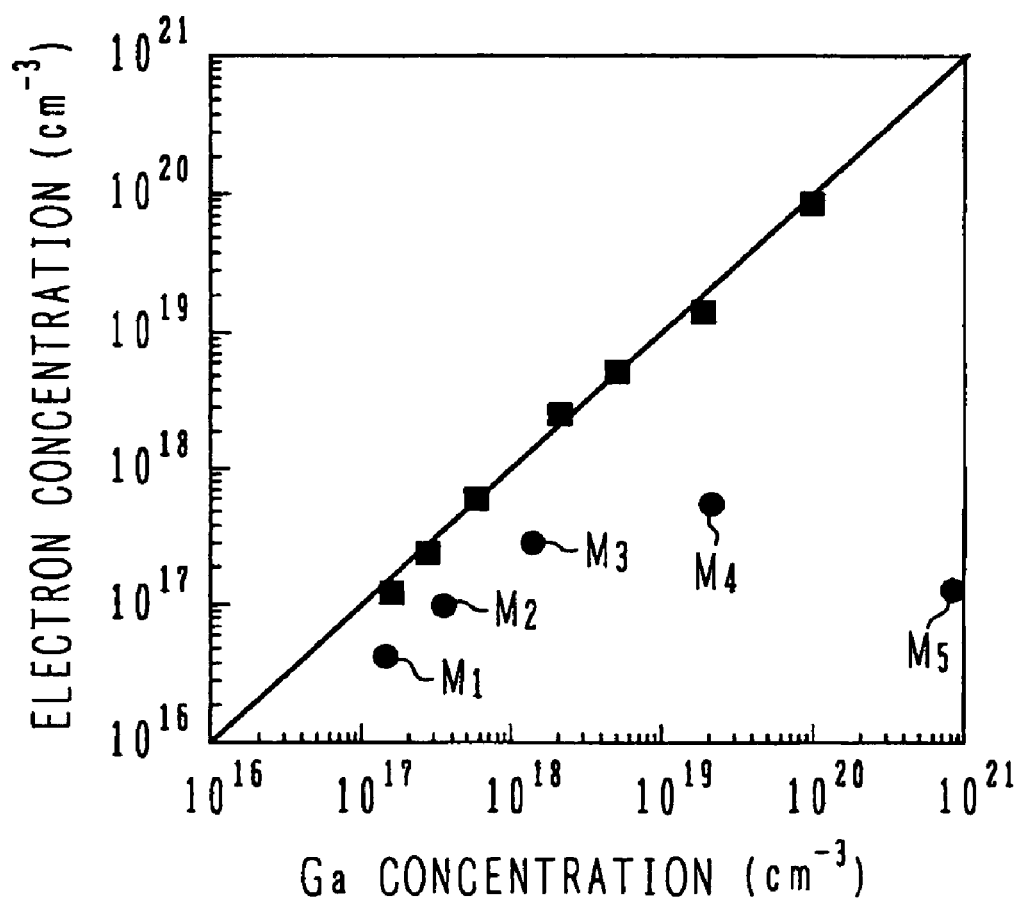
FIG. 9 is a graph showing the relation between a Ga concentration and a carrier concentration of n-type ZnO crystal grown by the second embodiment method and n-type ZnO crystal obtained by a third preliminary experiment.

The abscissa of the graph shown in FIG. 9 represents a Ga concentration (in the unit of cm$^{-3}$) and the ordinate represents an electron concentration (in the unit of cm$^{-3}$). Plotting with circle marks indicates the results of the preliminary experiment. Marks $M_1$ to $M_5$ correspond to the samples S400, S430, S460, S500 and S550, respectively. As the Ga knudsen cell temperature becomes high (as the Ga flux intensity becomes high), the Ga concentration increases. However, even if the Ga concentration is increased, the electron concentration does not increase correspondingly. Even if Ga is doped to about $1 \times 10^{21}$ cm$^{-3}$, the electron concentration remains in the order of $10^{17}$ cm$^{-3}$ at the maximum.

This reason will be studied. Replacement of Zn sites of ZnO crystal with Ga contributes to an increase in the concentration of n-type carriers (an increase in an electron concentration). However, under the O-rich condition, Ga is oxidized to Ga$_2$O$_3$ and the like, and it can be considered that Ga is likely to be captured in ZnO crystal in the state that Zn sites are not replaced with Ga. Because of this, even if the Ga concentration in ZnO crystal becomes high, it can be considered that captured Ga does not contribute to an increase in the concentration of electrons operating as carriers (a Ga activation factor does not become high).

It can also be considered that since Ga is captured in ZnO crystal in the form of Ga$_2$O$_3$ and the like, three-dimensional growth and polycrystallization become likely to occur.

In order to use ZnO crystal, for example, for a light emitting device, an n-type carrier concentration (electron concentration) is desired to be $1 \times 10^{18}$ cm$^{-3}$ or higher. An n-type ZnO crystal growth method is desired which can two-dimensionally grow ZnO crystal exposing the Zn polarity plane and can obtain a sufficient carrier concentration.

By making the flux ratio satisfy the Zn-rich condition, oxidation of Ga can be suppressed and an activation factor of Ga can be improved. However, since three-dimensional growth occurs, the smoothness lowers.

FIGS. 12R1 and 12R2 show RHEED images of the sample doped with Ga under the Zn-rich condition taken by irradiating an electron beam along [11-20] direction and along [1-100] direction. FIG. 12M shows an AFM photograph of the sample surface. Both the diffraction images show the spot pattern, indicating three-dimensional growth. An RMS value of the surface roughness obtained through AFM observation was 23.3 nm. Since the RMS value of the sample is larger than 2 nm, it can be judged also from AFM observation that three-dimensional growth occurred. The Ga concentration of the sample was $5.6 \times 10^{18}$ cm$^{-3}$.

Figure 8A:
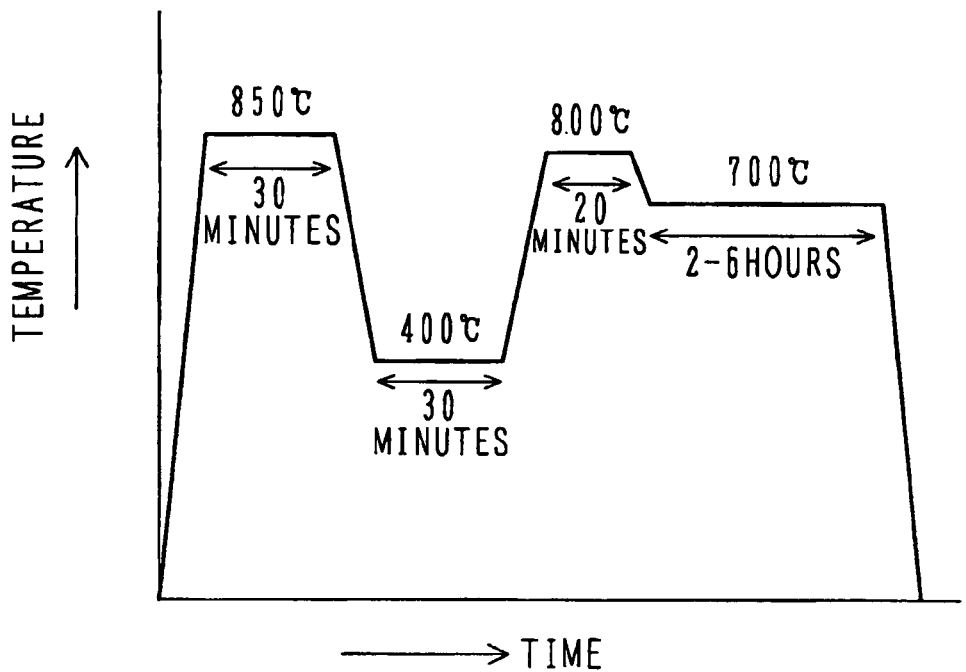
FIG. 8A is a graph showing a change in a substrate temperature with time during the whole processes of the n-type ZnO crystal growth method of the second embodiment.
Figure 8B:
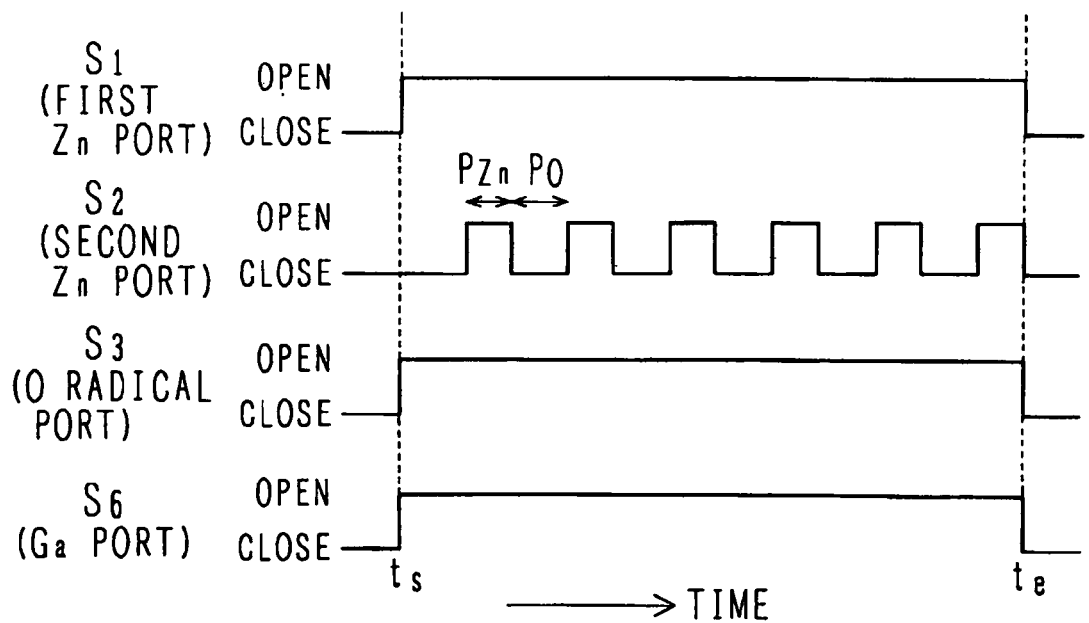
FIG. 8B is a timing chart illustrating a shutter control during the n-type ZnO crystal growth process of the second embodiment.

Next, with reference to FIGS. 8A and 8B, description will be made on the growth method for n-type ZnO crystal according to the second embodiment. FIG. 8A is a graph showing a change in a substrate temperature with time during the whole processes of ZnO crystal growth, and FIG. 8B is a timing chart illustrating shutter control in a growth process for Ga-doped n-type ZnO crystal.

Figure 7:
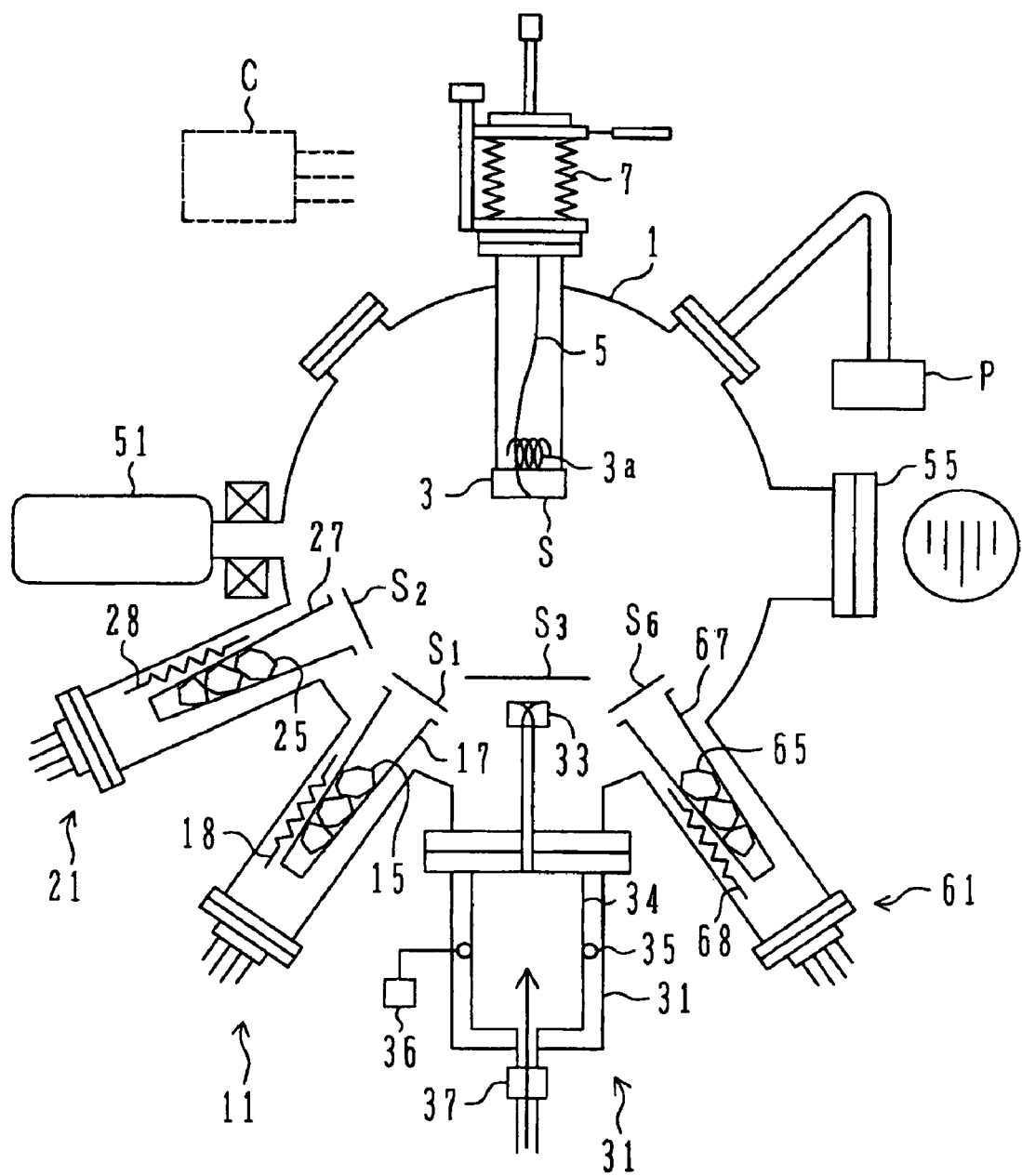
FIG. 7 is a schematic diagram showing a crystal growth system to be used by an n-type ZnO crystal growth method according to a second embodiment of the present invention.

After a ZnO substrate exposing the Zn polarity plane is held by the substrate holder 3 of the film forming system shown in FIG. 7, as shown in FIG. 8A, processes are executed including thermal cleaning (30 minutes at a substrate temperature of 850° C., for example), buffer layer growth (30 minutes at a substrate temperature of 400° C., for example) and buffer layer annealing (20 minutes at a substrate temperature of 800° C., for example). After the buffer layer annealing, Ga-doped n-type ZnO crystal is grown, for example, at a substrate temperature of 700° C. for 2 to 6 hours.

Next, with reference to FIG. 8B, detailed description will be made on a process of growing Ga-doped n-type ZnO crystal. The supply methods for O radicals and Zn are similar to those in the process of growing N-doped p-type ZnO crystal of the first embodiment. The period $P_{Zn}$ under the Zn-rich condition and the period $P_O$ under the O-rich condition are therefore alternately repeated. Similar to the p-type ZnO crystal growth method of the first embodiment, a thickness of the ZnO crystal layer deposited during one period $P_{Zn}$ is set in a range of 0.5 nm to 20 nm. A thickness of the ZnO crystal layer deposited during one period $P_O$ is set in a range of 0.25 nm to 2 nm.

As the Ga flux conditions, a temperature of the Knudsen cell 67 is set in a range of, e.g., 400° C. to 550° C. The shutter $S_6$ of the Ga port 61 is opened at a time $t_s$ and closed at a time $t_e$. During the period from the time $t_s$ to time $t_e$, Ga is supplied to the substrate S.

Next, with reference again to FIG. 9, description will be made on n-type ZnO crystal grown by the embodiment method. Seven types of n-type ZnO crystal were manufactured by changing the Ga Knudsen cell temperature (changing the Ga flux intensity).

The relation between a concentration of doped Ga and a carrier concentration (electron concentration) has been studied for these samples. In FIG. 9, the results are plotted by square marks. In the n-type ZnO crystal manufactured by the embodiment method, the Ga concentration is approximately equal to the electron concentration. It was possible to manufacture also n-type ZnO crystal whose Ga concentration and electron concentration are both about $1\times10^{20}$ cm$^{-3}$.

Measurements through RHEED and surface observation with an atomic force microscope (AFM) were conducted for the samples manufactured by the embodiment method. FIGS. 10R1 and 10R2 show RHEED images taken by irradiating an electron beam along [11-20] direction and along [1-100] direction. FIG. 10M shows an AFM photograph of the surface.

Both the diffraction images show the streak pattern, indicating two-dimensional growth. An RMS value of the surface roughness obtained through AFM observation was 0.58 nm. It can be judged also from AFM observation that two-dimensional growth occurred. The Ga concentration of the sample was $5.0\times10^{18}$ cm$^{-3}$.

As described above, Ga-doped n-type ZnO crystal can be grown two-dimensionally by using the n-type ZnO crystal growth method of the second embodiment. It is also possible to obtain a sufficient electron concentration (improve the Ga activation factor).

Since the Zn-rich condition and O-rich condition are repeated in the second embodiment method, it can be considered that oxidation of Ga can be suppressed more than crystal is grown only under the O-rich condition.

As n-type impurities of ZnO crystal, Al and In may be used in addition to Ga. Since Al and In are likely to be oxidized similar to Ga, the second embodiment method is expected to be effective for doping Al and In.

In the second embodiment, although Ga is supplied continuously, Ga may be supplied intermittently to grow n-type ZnO crystal.

The n-type ZnO crystal growth conditions are not limited to those of the second embodiment. For example, a substrate temperature during n-type ZnO crystal growth by molecular beam epitaxy may be set in a range of 500° C. to 850° C. The Zn flux intensity and O flux intensity are not limited to the values of the second embodiment.

In the second embodiment, although n-type ZnO crystal is grown by high frequency molecular beam epitaxy, the film forming method is not limited to molecular beam epitaxy. For example, metal organic chemical vapor deposition (MOCVD) may also be used.

As described above in the first and second embodiments, while Zn and O are supplied to the substrate by alternately repeating the Zn-rich condition period and O-rich condition period, conductivity type determining impurities are supplied so that impurities can be doped properly.

In the p-type ZnO crystal growth method of the first embodiment, while Zn and O are supplied to the substrate by alternately repeating the Zn-rich condition period and O-rich condition period, at least one of N, P and As is supplied to the substrate. Accordingly, ZnO crystal becomes likely to grow two-dimensionally, and N, P or As is likely to be captured in ZnO crystal.

With the first embodiment method, p-type ZnO crystal is doped with N at a concentration of $1\times10^{19}$ cm$^{-3}$ or higher, and has a high smoothness of the Zn polarity plane. This p-type ZnO crystal is therefore suitable for the material of, e.g., a light emitting device.

In the p-type ZnO crystal growth method of the first embodiment, the periods while a ratio of an O supply amount to a Zn supply amount takes first and second values are alternately repeated. Feasibility of capturing N, P or As into ZnO crystal changes with the ratio of the O supply amount to the Zn supply amount. By adjusting the time durations of the periods while the ratio of the O supply amount to the Zn supply amount take the first and second values, a concentration of N, P or As in p-type ZnO crystal can be adjusted.

In the n-type ZnO crystal growth method of the second embodiment, while Zn and O are supplied to the substrate by alternately repeating the Zn-rich condition period and O-rich condition period, at least one of Ga, Al and In is supplied to the substrate. Accordingly, the Zn polarity plane is likely to grow two-dimensionally, and the electron concentration can be increased easily.

With the second embodiment method, n-type ZnO crystal has the electron concentration of $10^{18}$ cm$^{-3}$ or higher and has a high smoothness of the Zn polarity plane. This n-type ZnO crystal is therefore suitable for the material of, e.g., a light emitting device.

The following advantages can be considered to be obtained by alternately repeating the period while the ratio of the O supply amount to the Zn supply amount takes the first value (e.g., Zn-rich condition period) and the period while the ratio takes the second value different from the first value (e.g., O-rich condition period).

Consider the case that the first value film forming condition has a large Zn supply amount than the second value film forming condition. Three-dimensional growth is not likely to occur during the second value period than the first value period. Doped Ga, Al or In is more difficult to be oxidized during the first value period than the second value period.

It is assumed that the ratio of the O supply amount to the Zn supply amount takes a third value which is an intermediate value between the first and second values. By alternately repeating the first value period and second value period, it can be considered that it becomes easier to form a film in such a manner that three-dimensional growth is not likely to occur and oxidation of Ga or the like is not likely to occur, than forming a film only under the third value film forming condition.

Next, with reference to FIG. 13, description will be made on a crystal growth system to be used by a light emitting device manufacture method according to the third embodiment. Also in the light emitting device manufacture method of the third embodiment, a crystal growth system with high frequency molecular beam epitaxy is used similar to the crystal growth methods of the first and second embodiments.

A chamber 101 has a first Zn port 111 and a second Zn port 121 for supplying Zn, an O radical port 131 for supplying O radicals, an N radical port 141 for supplying N radicals, a Ga port 161 for supplying Ga, and an Mg port 171 for supplying Mg.

The first and second Zn ports 111 and 121 are each equipped with a Knudsen cell for accommodating Zn source material, the Ga port 161 is equipped with a Knudsen cell for accommodating Ga source material, and the Mg port 171 is equipped with a Knudsen cell for accommodating Mg source material. The O radical port 131 and N radical port 141 are each equipped with a inductive coupled discharge tube.

A substrate 211 as an underlying substrate for crystal growth is held by a substrate holder 103. A heater 103a heats the substrate 211. A vacuum pump P evacuates the inside of the chamber 101. The chamber 101 is mounted with a gun 151 for RHEED and a screen 155 for displaying a RHEED image.

By using this crystal growth system, it becomes possible to grow a ZnO layer and a ZnMgO layer of an N-doped p-type and a ZnO layer and a ZnMgO layer of a Ga-doped n-type.

Next, with reference to FIGS. 14A to 14C, description will be made on a manufacture method for a light emitting device according to the third embodiment. FIG. 14A is a schematic cross sectional view of a light emitting device. A substrate 211 as an underlying substrate for crystal growth is, for example, a ZnO substrate exposing the Zn polarity plane.

By using the first (or second) embodiment method, first, the substrate 211 is subjected to thermal cleaning, and thereafter a buffer layer 212 of ZnO is formed on the substrate 211. After the buffer layer 212 is formed, the buffer layer 212 is subjected to annealing. Next, by the second embodiment method, a Ga-doped n-type ZnO layer 213 is formed on the buffer layer 212.

Next, an n-type ZnMgO layer 214 as a clad layer is formed on the n-type ZnO layer 213. While Zn, O and Ga and in addition Mg are supplied to the substrate by alternately repeating the Zn-rich condition period and O-rich condition period, similar to the method of forming the n-type ZnO layer 213.

Next, a ZnO/ZnMgO quantum well layer 215 as an active layer is formed on the n-type ZnMgO layer 214. Impurities are not doped. A substrate heater temperature is, for example, 500° C. to 900° C.

As shown in FIG. 14B, the ZnO/ZnMgO quantum well layer 215 has a lamination structure of a well layer 215w of ZnO and a barrier layer 215b of ZnMgO. As shown in FIG. 14C, the ZnO/ZnMgO quantum well layer 215 may have a multiple quantum well structure formed by alternately laminating a plurality of well layers 215w and barrier layer 215b. The material of the active layer may be mixed crystal of (Zn, Mg, Cd) (O, S, Se, Te).

Description will continue by referring again to FIG. 14A. A p-type ZnMgO layer 216 as a clad layer is formed on the ZnO/ZnMgO quantum well layer 215. Zn, O and N and in addition Mg are supplied to the substrate by alternately repeating the Zn-rich condition period and O-rich condition period. Next, an N-doped p-type ZnO layer 217 is formed on the p-type ZnMgO layer 216 by the first embodiment method.

The n-type ZnMgO layer 214 and p-type ZnMgO layer 216 as the clad layers have preferably a band gap larger by 0.2 eV than that of the ZnO/ZnMgO quantum well layer 215 as the active layer.

The substrate 211 formed with the buffer layer 212 to p-type ZnO layer 217 is picked up from the chamber 101 of the film forming system. Next, a resist pattern having a predetermined opening is formed on the p-type ZnO layer 217, and the p-type ZnO layer 217, p-type ZnMgO layer 216, ZnO/ZnMgO quantum well layer 215 and n-type ZnMgO layer 214 are etched to expose a partial surface of the n-type ZnO layer 213. The etching method may be wet etching or reactive ion etching. After the etching, the resist pattern is removed.

A titanium layer having a thickness of, e.g., 2 nm to 10 nm is formed on the surface of the exposed n-type ZnO layer 213, and an aluminum layer having a thickness of 300 nm to 500 nm is formed on the titanium layer to form an n-side electrode 218.

Next, a nickel layer having a thickness of, e.g., 0.3 nm to 30 nm is formed on the p-type ZnO layer 217, and a gold layer having a thickness of 10 nm is formed on the nickel layer to form a p-side electrode 219. A gold layer having a thickness of, e.g., 500 nm is formed on the p-side electrode 219 to form a p-side bonding electrode 220. For example, a lift-off method is used for forming the n-side electrode 218, p-side electrode 219 and p-side bonding electrode 220.

Thereafter, the electrodes are subjected to an alloying process in an oxygen atmosphere at a temperature of, e.g., 400° C. to 800° C. A process time is, for example, 30 sec to 5 min. By the method described above, a light emitting device can be manufactured.

The method of forming the n-type ZnO layer 213 and n-type ZnMgO layer 214 of the light emitting device is not limited to the second embodiment method. For example, these layers may be formed in the following manner. On the buffer layer 212 shown in FIG. 14A, a Ga-doped n-type ZnO layer 213 is formed under the O-rich condition. For example, the O-rich conditions are an O flux intensity $J_O$ of $1.0 \times 10^{15}$ atoms/cm²s and a Zn flux intensity $J_{Zn}$ of $2.0 \times 10^{14}$ atoms/cm²s. Ga is supplied to set a Ga concentration in the n-type ZnO layer 213 to $5.5 \times 10^{17}$ cm$^{-3}$ to $2.0 \times 10^{19}$ cm$^{-3}$.

A thickness of the n-type ZnO layer 213 is, for example, 1 μm to 2 μm, and the n-type ZnO layer is grown at a substrate heater temperature of 500° C. or lower. After the n-type ZnO layer 213 is grown, annealing is performed for one hour at a substrate heater temperature of 800° C. to 1020° C.

Next, an n-type ZnMgO layer 214 having a thickness of e.g., 100 nm to 600 nm is formed on the n-type ZnO layer 213 at a substrate temperature of, e.g., 300° C. to 500° C. Thereafter, the n-type ZnMgO layer 214 is annealed at a substrate temperature of 800° C. to 1020° C.

The n-type ZnO layer 213 and n-type ZnMgO layer 214 may be formed, for example, in the following manner. On the buffer layer 212 shown in FIG. 14A, a Ga-doped n-type ZnO layer 213 is formed under the Zn-rich condition. For example, the Zn-rich conditions are a ratio $K_O J_O / k_{Zn} J_{Zn}$ of 0.35 or smaller, $K_O J_O/k_{Zn} J_{Zn}$ being a ratio of a product $k_O J_O$ of an O sticking coefficient $k_O$ and an O flux intensity $J_O$ to a product $k_{Zn} J_{Zn}$ of a Zn sticking coefficient $k_{Zn}$ and a Zn flux intensity $J_O$. Ga is supplied to set a Ga concentration in the n-type ZnO layer 213 to $5.0 \times 10^{17}$ cm$^{-3}$ to $7.0 \times 10^{19}$ cm$^{-3}$.

A thickness of the n-type ZnO layer 213 is, for example, 1 μm to 2 μm, and the n-type ZnO layer is grown at a substrate heater temperature of 850° C. to 1100° C. The substrate heater temperature of 850° C. to 1100° C. corresponds to a substrate surface temperature of 740° C. to 900° C.

Next, an n-type ZnMgO layer 214 having a thickness of e.g., 100 nm to 600 nm is formed on the n-type ZnO layer 213 at a substrate heater temperature lower than the temperature at which the n-type ZnO layer 213 was formed.

Next, with reference to FIG. 15, description will be made on a light emitting device manufacture method according to the fourth embodiment. The light emitting device of the fourth embodiment is different from that of the third embodiment in a mounting method for n- and p-side electrodes.

Similar to the light emitting device of the third embodiment, the layers up to the p-type ZnO layer 217 are formed on a substrate 211. The substrate 211 is a ZnO substrate having n-type conductivity. A p-side electrode 219*a* is formed on the p-type ZnO layer 217 and an n-side electrode 218*a* is formed on the bottom of the substrate 211.

The present invention has been described in connection with the preferred embodiments. The invention is not limited only to the above embodiments. It will be apparent to those skilled in the art that other various modifications, improvements, combinations, and the like can be made.

What are claimed are:

1. A ZnO crystal growth method comprising steps of:
  (a) loading a substrate having a surface capable of growing ZnO crystal exposing a Zn polarity plane into a growth chamber; and
  (b) epitaxially and two-dimensionally growing an impurities-doped ZnO layer, by supplying Zn and O above the surface of said substrate in said growth chamber by alternately repeating a Zn-rich condition period, which grows ZnO, and an O-rich condition period, which grows ZnO, while supplying conductivity type determining impurities above the surface of said substrate.

2. The ZnO crystal growth method according to claim 1, wherein said step (b) supplies at least one of N, P and As of p-type impurities as said conductivity type determining impurities.

3. The ZnO crystal growth method according to claim 2, wherein at said step (b), a ZnO layer having a thickness of 0.5 nm to 20 nm is grown during one Zn-rich condition period and a ZnO layer having a thickness of 0.25 nm to 2 nm is grown during one O-rich condition period.

4. The ZnO crystal growth method according to claim 2, wherein at said step (b), Zn and O are supplied by molecular beam epitaxy, Zn is supplied from a first Zn supply cell during the O-rich condition period, and Zn is supplied from said first Zn supply cell and a second Zn supply cell during the Zn-rich condition period.

5. The ZnO crystal growth method according to claim 2, wherein said substrate is a ZnO substrate, and the surface capable of growing ZnO crystal exposing the Zn polarity plane is a Zn polarity plane of said ZnO substrate.

6. The ZnO crystal growth method according to claim 2, wherein said step (b) includes a step of supplying at least one of Ga, Al and In of n-type impurities as said conductivity type determining impurities.

7. The ZnO crystal growth method according to claim 1, wherein said step (b) supplies at least one of Ga, Al and In of n-type impurities as said conductivity type determining impurities.

8. The ZnO crystal growth method according to claim 7, wherein at said step (b), a ZnO layer having a thickness of 0.5 nm to 20 nm is grown during one Zn-rich condition period and a ZnO layer having a thickness of 0.25 nm to 2 nm is grown during one O-rich condition period.

9. The ZnO crystal growth method according to claim 7, wherein at said step (b), Zn and O are supplied by molecular beam epitaxy, Zn is supplied from a first Zn supply cell during the O-rich condition period, and Zn is supplied from said first Zn supply cell and a second Zn supply cell during the Zn-rich condition period.

10. The ZnO crystal growth method according to claim 7, wherein said substrate is a ZnO substrate, and the surface capable of growing ZnO crystal exposing the Zn polarity plane is a Zn polarity plane of said ZnO substrate.

11. A ZnO crystal growth method comprising steps of:
  (a) loading a substrate having a surface capable of growing ZnO crystal exposing a Zn polarity plane into a growth chamber; and
  (b) epitaxially and two-dimensionally growing an impurities-doped ZnO layer, by supplying Zn and O above the surface of said substrate in said growth chamber by alternately repeating a period in which a ratio of an O supply amount to a Zn supply amount takes a first value, which grows ZnO, and a period in which the ratio takes a second value different from said first value, which grows ZnO, while supplying conductivity type determining impurities above the surface of said substrate.

12. The ZnO crystal growth method according to claim 11, wherein said step (b) supplies at least one of N, P and As of p-type impurities as said conductivity type determining impurities.

13. The ZnO crystal growth method according to claim 12, wherein said step (b) includes a step of supplying at least one of Ga, Al and In of n-type impurities as said conductivity type determining impurities.

14. The ZnO crystal growth method according to claim 11, wherein said step (b) supplies at least one of Ga, Al and In of n-type impurities as said conductivity type determining impurities.

15. A ZnO crystal of a p-type conductivity exposing a Zn polarity plane on a surface thereof and doped with N at a concentration of $1 \times 10^{19}$ cm$^{-3}$ or higher, wherein a diffraction image of said surface observed through reflection high-energy electron diffraction shows a streak pattern.

16. A ZnO crystal of a p-type conductivity exposing a Zn polarity plane on a surface thereof and doped with N at a concentration of $1 \times 10^{19}$ cm$^{-3}$ or higher, wherein a an RMS value of a roughness of said surface measured with an atomic force microscope is 2 nm or smaller.

17. A ZnO crystal of an n-type conductivity exposing a Zn polarity plane on a surface thereof, doped with Ga at a concentration of $1 \times 10^{18}$ cm$^{-3}$ or higher, and having an electron concentration of $10^{18}$ cm$^{-3}$ or higher, wherein a diffraction image of said surface observed through reflection high-energy electron diffraction shows a streak pattern.

18. A ZnO crystal of an n-type conductivity exposing a Zn polarity plane on a surface thereof, doped with Ga at a concentration of $1 \times 10^{18}$ cm$^{-3}$ or higher, and having an electron concentration of $10^{18}$ cm$^{-3}$ or higher, wherein a an RMS value of a roughness of said surface measured with an atomic force microscope is 2 nm or smaller.

19. A light emitting device manufacture method comprising steps of:
(a) preparing a substrate having a surface capable of growing ZnO crystal exposing a Zn polarity plane;
(b) growing an n-type ZnO layer doped with n-type impurities above said surface of said substrate;
(c) epitaxially and two-dimensionally growing a p-type ZnO layer doped with p-type impurities above said surface of said substrate;
(d) forming an active layer between said n-type ZnO layer and said p-type ZnO layer;
(e) forming an n-side electrode for applying voltage to said n-type ZnO layer; and
(f) forming a p-side electrode for applying voltage to said p-type ZnO layer,
wherein said step (c) includes steps of:
(c-1) supplying Zn and O by alternately repeating a Zn-rich condition period, which grows ZnO, and an O-rich condition period, which grows ZnO; and
(c-2) supplying at least one of N, P and As while Zn and O are supplied at said step (c-1).

20. A light emitting device manufacture method comprising steps of:
(a) preparing a substrate having a surface capable of growing ZnO crystal exposing a Zn polarity plane;
(b) growing an n-type ZnO layer doped with n-type impurities above said surface of said substrate;
(c) epitaxially and two-dimensionally growing a p-type ZnO layer doped with p-type impurities above said surface of said substrate;
(d) forming an active layer between said n-type ZnO layer and said p-type ZnO layer;
(e) forming an n-side electrode for applying voltage to said n-type ZnO layer; and
(f) forming a p-side electrode for applying voltage to said p-type ZnO layer,
wherein said step (c) includes steps of:
(c-1) supplying Zn and O by alternately repeating a period while a ratio of an O supply amount to a Zn supply amount takes a first value, which grows ZnO, and a period in which the ratio takes a second value different from said first value, which grows ZnO; and
(c-2) supplying at least one of N, P and As while Zn and O are supplied at said step (c-1).

21. The ZnO crystal growth method according to claim 1, wherein said step (b) two-dimensionally grows the impurities-doped p-type ZnO layer having a concentration of the impurities within a range between about $5\times10^{18}$ cm$^{-3}$ and about $6\times10^{20}$ cm$^{-3}$.

22. The ZnO crystal growth method according to claim 11, wherein said step (b) two-dimensionally grows the impurities-doped p-type ZnO layer having a concentration of the impurities within a range between about $5\times10^{18}$ cm$^{-3}$ and about $6\times10^{20}$ cm$^{-3}$.

23. A ZnO crystal growth method comprising steps of:
(a) loading a substrate having a surface capable of growing ZnO crystal exposing a Zn polarity plane into a growth chamber; and
(b) epitaxially and two-dimensionally growing an impurities-doped p-type ZnO layer, by supplying Zn and O above the surface of said substrate in said growth chamber by alternately repeating a Zn-rich condition period, which grows ZnO, and an O-rich condition period, which grows ZnO, while supplying p-type impurities above the surface of said substrate so that the two-dimensionally grown impurities-doped p-type ZnO layer has a concentration of the p-type impurities within a range between about $5\times10^{18}$ cm$^{-3}$ and about $6\times10^{20}$ cm$^{-3}$.

* * * * *